United States Patent
Parsa et al.

(10) Patent No.: US 10,591,872 B2
(45) Date of Patent: Mar. 17, 2020

(54) MICROFABRICATED ATOMIC CLOCKS AND MAGNETOMETERS UTILIZING SIDE RECESSES

(71) Applicant: Texas Instruments Incorporated, Dallas, TX (US)

(72) Inventors: Roozbeh Parsa, Portola Valley, CA (US); Iouri N Mirgorodski, Sunnyvale, CA (US); William French, San Jose, CA (US); Nathan Brockie, Edinburgh (GB); Ann Gabrys, Woodside, CA (US); Terry Dyer, Largs (GB)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 154 days.

(21) Appl. No.: 15/457,608

(22) Filed: Mar. 13, 2017

(65) Prior Publication Data

US 2018/0259600 A1    Sep. 13, 2018

(51) Int. Cl.
*H01L 21/00* (2006.01)
*G04F 5/14* (2006.01)
*H03L 7/26* (2006.01)

(52) U.S. Cl.
CPC .. *G04F 5/14* (2013.01); *H03L 7/26* (2013.01)

(58) Field of Classification Search
CPC .. G01R 33/26; G04F 5/14; H03L 7/26; H01L 31/0352; H01L 31/035281; H01L 31/03529; H01L 31/0232–02327; H01L 31/054–056; H01L 31/024; H01L 31/052–0525; H01L 31/00–208; H01L 41/00–1138; H01L 27/20; H02S 50/00–15; H02S 40/20–22; H02S 40/42–425; B81B 1/00–008; B81B 3/00–0097; B81B 5/00; B81B 7/00–04; B81B 2201/00–0292; B81B 2203/00–06; B81B 2207/00–99; G01N 27/129
USPC .......................................................... 438/48
See application file for complete search history.

(56) References Cited

U.S. PATENT DOCUMENTS

| | | | |
|---|---|---|---|
| 2006/0022761 | A1 | 2/2006 | Abeles et al. |
| 2008/0121042 | A1 | 5/2008 | Miller et al. |
| 2011/0054938 | A1 | 3/2011 | Hood et al. |
| 2012/0079876 | A1 | 4/2012 | Stroock et al. |

(Continued)

OTHER PUBLICATIONS

U.S. Appl. No. 15/457,669, filed Mar. 13, 2017 (30 pages).

*Primary Examiner* — Calvin Y Choi
(74) *Attorney, Agent, or Firm* — Andrew R. Ralston; Charles A. Brill; Frank D. Cimino

(57) ABSTRACT

An integrated microfabricated sensor includes a sensor cell having a cell body, a first window attached to a first surface, and a second window attached to a second surface, opposite to the first window. The cell body laterally surrounds a cavity, so that the first window and the second window are exposed to the cavity. The sensor cell contains a sensor fluid material in the cavity. The cell body has recesses on opposing exterior sides of the cell body; each recess extends from the first surface to the second surface. Exterior portions of the cell body wall in the recesses are recessed from singulation surfaces on the cell body exterior. The cell body is formed by etching the cavity and the recesses concurrently through a body substrate. After the windows are attached, the sensor cell is singulated from the body substrate through the recesses.

23 Claims, 14 Drawing Sheets

(56) References Cited

U.S. PATENT DOCUMENTS

2015/0362394 A1* 12/2015 Shimoyama .......... G01L 9/0001
73/702
2016/0169989 A1   6/2016 Suzuki et al.

* cited by examiner

MICROFABRICATED ATOMIC CLOCKS AND MAGNETOMETERS UTILIZING SIDE RECESSES

FIELD

This disclosure relates to the field of integrated microfabricated sensors. More particularly, this disclosure relates to sensor cells in integrated microfabricated sensors.

BACKGROUND

An integrated microfabricated sensor may include a sensor cell containing a sensor fluid such as an alkali metal in a cavity of the sensor cell. The sensor cell is frequently fabricated from a single crystal silicon wafer, using conventional etching techniques. The sensor cell has one or more windows exposed to the cavity. The sensor fluid is vaporized during operation, and electromagnetic signals are transmitted from a signal emitter outside the cavity through the windows into the cavity and are transmitted from the cavity through the windows to a detector outside the cavity. When the integrated microfabricated sensor is not in operation, the sensor fluid cools and condenses inside the cavity. Condensation of the sensor fluid on the windows degrades signal transmission during subsequent periods of operation. Some sensor cells are designed to generate a thermal gradient in the cavity to promote condensation of the sensor fluid away from the windows. However, silicon has a high thermal conductivity, which reduces the magnitude of the thermal gradient, thus exacerbating the condensation problem. Reducing the wall thickness of the cell body is problematic, due to cracks and fractures propagating from singulation surfaces of the silicon when the cell body is singulated from the silicon starting substrate.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

An integrated microfabricated sensor includes a sensor cell having a cell body, a first window, and a second window. The cell body has a first surface, which is flat, and a second surface, which is also flat, parallel to the first surface and located on an opposite side of the cell body from the first surface. The cell body laterally surrounds a cavity which extends from the first surface to the second surface. The first window is attached to the first surface and extends across the cavity, so that the first window is exposed to the cavity. The second window is attached to the second surface and extends across the cavity, so that the second window is also exposed to the cavity. The sensor cell contains a sensor fluid material in the cavity. The cell body has recesses on opposing exterior sides of the cell body; each recess extends from the first surface to the second surface.

The cell body is formed by etching the cavity and the recesses concurrently through a body substrate. After the cavity and recesses are formed, the first window is attached to the first surface and the second window is attached to the second surface. After the windows are attached, the sensor cell is singulated from the body substrate through the recesses, so that the cell body walls in the recesses do not have material removed during the singulation process.

DETAILED DESCRIPTION

Figure 1:
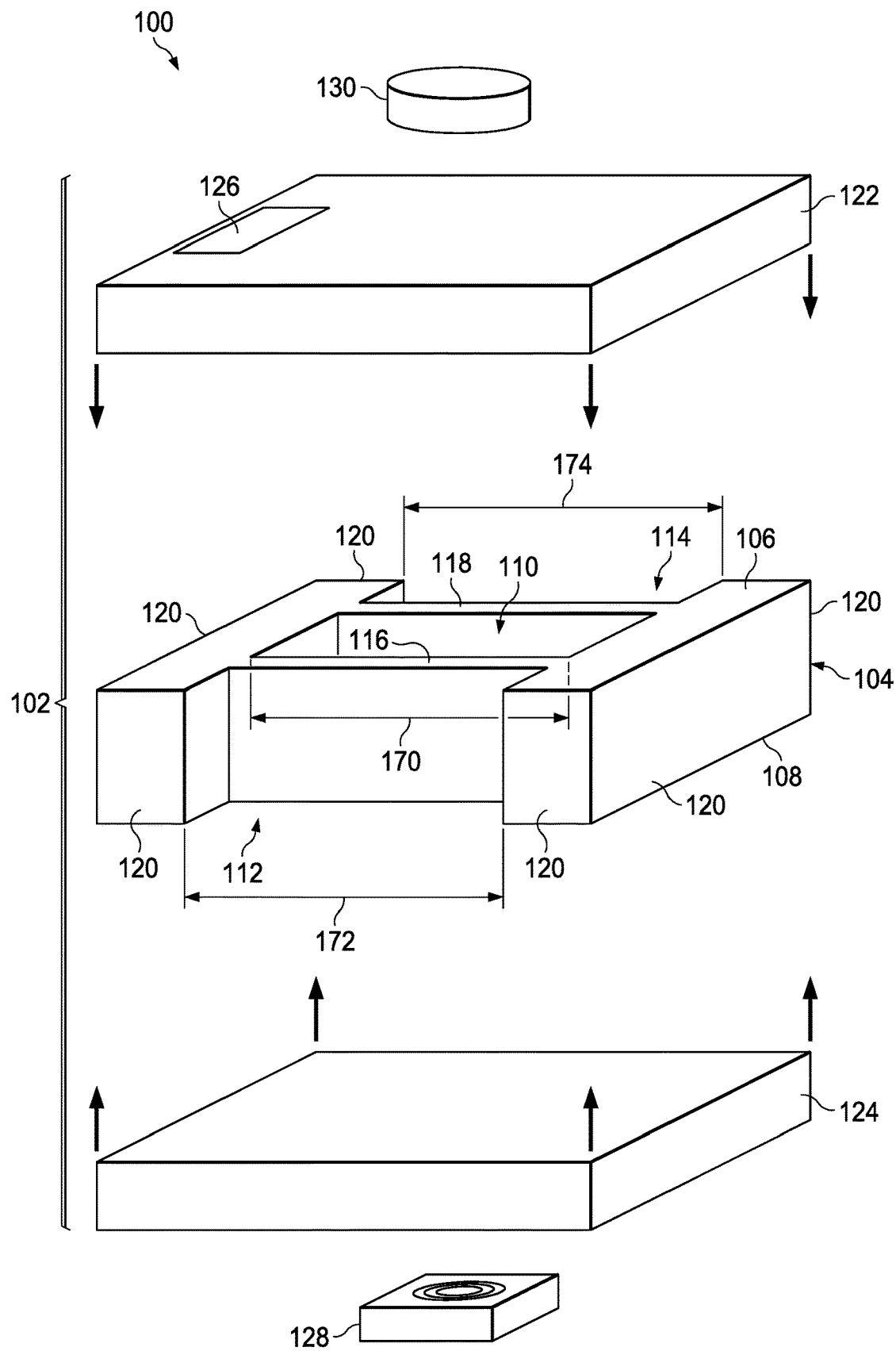
FIG. 1 is an exploded view of an example integrated microfabricated sensor.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The following co-pending patent application is related and hereby incorporated by reference: U.S. patent application Ser. No. 15/457,669 filed on even date herewith. With its mention in this section, this patent application is not admitted to be prior art with respect to the present invention.

An integrated microfabricated sensor, which may be, for example, an integrated microfabricated atomic clock (MFAC) or an integrated microfabricated atomic magnetometer (MFAM), includes a sensor cell having a cell body, a first window, and a second window. The cell body has a first surface, which is flat, and a second surface, which is also flat, parallel to the first surface and located on an opposite side of the cell body from the first surface. The cell body laterally surrounds a cavity which extends from the first surface to the second surface. The first window is attached to the first surface and extends across the cavity, so that the first window is exposed to the cavity. The second window is attached to the second surface and extends across the cavity, so that the second window is also exposed to the cavity. The sensor cell contains a sensor fluid material, for example cesium or rubidium, in the cavity. The cell body has recesses on opposing exterior sides of the cell body; each recess extends from the first surface to the second surface. Exterior portions of the cell body wall in the recesses are recessed from singulation surfaces on the cell body exterior. At least half of the cavity is located between the recesses, to provide an effective reduction of resistance to cracks and fractures propagating to the cavity from the singulation surfaces.

The integrated microfabricated sensor includes a signal emitter located proximate to the first window or the second window. In one context of the instant disclosure, the signal emitter being proximate to the first window or the second window may be manifested by the signal emitter being located within a few millimeters of the first window or the second window and facing the first window or the second window. In another context, the signal emitter being proximate to the first window or the second window may be manifested by the signal emitter being located within a few millimeters of the first window or the second window and being configured to emit an input signal into the cavity through at least one of the first window or the second window. The integrated microfabricated sensor further includes a signal detector located proximate to the first window or the second window. In one context of the instant disclosure, the signal detector being proximate to the first window or the second window may be manifested by the signal detector being located within a few millimeters of the first window or the second window and facing the first window or the second window. In another context, the signal detector being proximate to the first window or the second window may be manifested by the signal detector being located within a few millimeters of the first window or the second window and being configured to detect an output signal from the cavity through at least one of the first window or the second window.

The cell body is formed starting with a body substrate, then etching the cavity and the recesses concurrently through the body substrate. After the cavity and recesses are formed, the first window is attached to the first surface and the second window is attached to the second surface. The sensor fluid material is disposed in the cavity, for example after attaching the first window, and before attaching the second window. After the windows are attached, the sensor cell is singulated from the body substrate. The singulation process may include sawing, mechanical scribing, or laser scribing. The cell body walls abutting the recesses are recessed from singulation zones, for example saw streets or scribe lines, and do not have any material removed during the singulation process, advantageously reducing crack propagation in the cell body from the singulation process. Cell body walls which extend to the singulation zones must be thicker to withstand mechanical stress from the singulation process. The cell body walls abutting the recesses may be formed thinner than walls in a cell body without the recesses, due to the absence of the mechanical stress during singulation.

During operation of the integrated microfabricated sensor, the sensor cell is heated to vaporize the sensor fluid. A thermal gradient may be generated in the sensor cell to induce condensation of the sensor fluid at a point away from the first window and the second window. The thinner cell body walls abutting the recesses may advantageously enable a larger thermal gradient for a given power level compared to a cell body without recesses.

For the purposes of this disclosure, the term "lateral" is understood to refer to a direction parallel to the first surface and the second surface the cell body. The term "vertical" is understood to refer to a direction perpendicular to the first surface and the second surface the cell body. The term "exterior" is understood to refer to lateral surfaces of the cell body outside of the cavity.

It is noted that terms such as top, bottom, front, back, over, above, under, and below may be used in this disclosure. These terms should not be construed as limiting the position or orientation of a structure or element, but should be used to provide spatial relationship between structures or elements.

FIG. 1 is an exploded view of an example integrated microfabricated sensor. The integrated microfabricated sensor 100 includes a sensor cell 102, which includes a cell body 104 having a first surface 106 and a second surface 108. The first surface 106 is flat. The second surface 108 is also flat, and is parallel to the first surface 106. The second surface is located on an opposite side of the cell body 104 from the first surface 106. The cell body 104 laterally surrounds a cavity 110. The cavity 110 extends from the first surface 106 through the cell body 104 to the second surface 108. The cavity 110 has an average length 170 in a direction parallel to the first surface 106.

The cell body 104 has a first recess 112 on a first exterior side of the cell body 104, with an average length 172 in a direction parallel to the average length 170 of the cavity 110. The average length 172 of the first recess 112 overlaps at least half of the average length 170 of the cavity 110. The cell body 104 has a second recess 114 on a second exterior side of the cell body 104, with an average length 174 in a direction parallel to the average length 170 of the cavity 110. The second recess 114 is located on an opposite side of the cell body 104 from the first recess 112. The average length 174 of the second recess 114 also overlaps at least half of the average length 170 of the cavity 110. In the instant example, the average length 172 of the first recess 112 and the average length 174 of the second recess 114 may both be approximately equal to, and aligned with, the average length 170 of the cavity 110, as depicted in FIG. 1. The first recess 112 and the second recess 114 extend from the first surface 106 to the second surface 108. A first cell body wall 116 of the cell body 104 is that portion of the cell body 104 between the first recess 112 and the cavity 110. A second cell body wall 118 of the cell body 104 is that portion of the cell body 104 between the second recess 114 and the cavity 110. The first cell body wall 116 and the second cell body wall 118 are recessed, and not coplanar, with singulated lateral surfaces 120 of the cell body 104. The singulated lateral surfaces 120 are those lateral surfaces of the cell body 104 which were created by a singulation process to separate the cell body 104 from a body substrate. The singulated lateral surfaces 120 may possibly have a rough texture resulting from the singulation process.

The sensor cell 102 further includes a first window 122 that is attached to the cell body 104 on the first surface 106. The first window 122 is exposed to the cavity 110. The sensor cell 102 further includes a second window 124 that is attached to the cell body 104 on the second surface 108. The second window 124 is also exposed to the cavity 110. A heater 126 is disposed on the sensor cell 102, for example on the first window 122 as depicted in FIG. 1.

Sensor fluid material, not shown in FIG. 1, is disposed in the cavity 110. The sensor fluid material may be primarily in the form of a condensed state of a sensor fluid. The sensor fluid may be, for example, cesium vapor or rubidium vapor, and the condensed state of the sensor fluid may be solid cesium or solid rubidium, respectively. Other materials for the sensor fluid and the condensed state of the sensor fluid are within the scope of the instant example.

The cell body 104 may include primarily crystalline silicon, or other material suitable for providing hermetic seals with the first window 122 and the second window 124, and for maintaining structural integrity of the cavity 110. The first window 122 and the second window 124 may include primarily glass or other material appropriate for passing signals into and out of the cavity 110 and for providing hermetic seals with the cell body 104. Having the cell body 104 of crystalline silicon and the first window 122 and the second window 124 of glass advantageously enables bonding the first window 122 and the second window 124 to the cell body 104 by an anodic bonding process, producing a desired quality of hermetic seals. Other materials for the cell body 104, the first window 122, and the second window 124 are within the scope of the instant example.

The integrated microfabricated sensor 100 further includes a signal emitter 128 located outside of the sensor cell 102, configured to emit an input signal through the second window 124 into the cavity 110. The integrated microfabricated sensor 100 further includes a signal detector 130 located outside of the sensor cell 102, configured to detect an output signal through the first window 122 from the cavity 110.

During operation of the integrated microfabricated sensor 100, the heater 126 may be operated so as to generate a thermal gradient in the sensor cell 102 for the purpose of reducing condensation of the sensor fluid on the first window 122 and the second window 124. Having the first recess 112 and the second recess 114 in the cell body 104, so that the first cell body wall 116 and the second cell body wall 118 are thinner than walls in a comparable cell body without recesses, may advantageously enable maintaining a desired thermal gradient with less power applied to the heater 126, due to less thermal conduction along the first cell body wall 116 and the second cell body wall 118.

Figure 2:
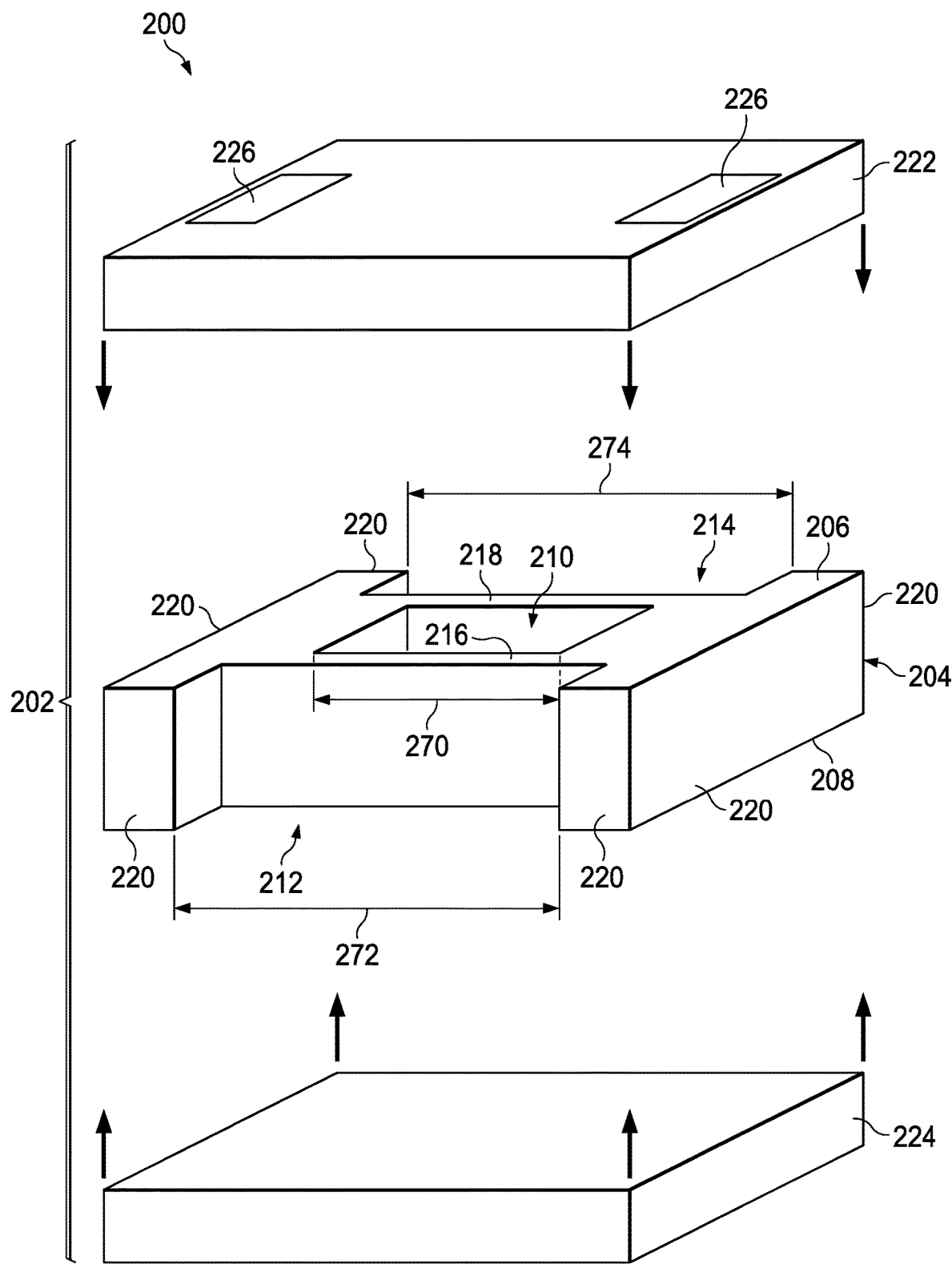
FIG. 2 is an exploded view of another example integrated microfabricated sensor.

FIG. 2 is an exploded view of another example integrated microfabricated sensor. The integrated microfabricated sensor 200 includes a sensor cell 202, which includes a cell body 204 having a first surface 206 and a second surface 208 parallel to, and opposite from, the first surface 206. A cavity 210 extends through the cell body 204 from the first surface 206 through the cell body 204 to the second surface 208. The cavity 210 has an average length 270 in a direction parallel to the first surface 206.

The cell body 204 has a first recess 212 on a first exterior side of the cell body 204, with an average length 272 in a direction parallel to the average length 270 of the cavity 210. The average length 272 of the first recess 212 overlaps at least half of the average length 270 of the cavity 210. The cell body 204 further has a second recess 214 on a second exterior side of the cell body 204 opposite from the first recess 212. The second recess 214 has an average length 274 in a direction parallel to the average length 270 of the cavity 210. The average length 274 of the second recess 214 also overlaps at least half of the average length 270 of the cavity 210. The first recess 212 and the second recess 214 extend from the first surface 206 to the second surface 208. A first cell body wall 216 of the cell body 204 is that portion of the cell body 204 between the first recess 212 and the cavity 210. A second cell body wall 218 of the cell body 204 is that portion of the cell body 204 between the second recess 214 and the cavity 210. In the instant example, the first recess 212 and the second recess 214 extend past ends of the cavity 210. The first cell body wall 216 and the second cell body wall 218 are recessed from singulation surfaces 220 of the cell body 204.

The sensor cell 202 further includes a first window 222 that is attached to the cell body 204 on the first surface 206, so that the first window 222 is exposed to the cavity 210. The sensor cell 202 further includes a second window 224 that is attached to the cell body 204 on the second surface 208, so that the second window 224 is also exposed to the cavity 210. Heaters 226 are disposed on the sensor cell 202, for example on the first window 222 at opposite ends of the cavity 210, as depicted in FIG. 2. Sensor fluid material, not shown in FIG. 2, is disposed in the cavity 210.

During operation of the integrated microfabricated sensor 200, the heaters 226 may be operated so as to generate a thermal gradient in the sensor cell 202 for the purpose of reducing condensation of the sensor fluid on the first window 222 and the second window 224. Having the first recess 212 and the second recess 214 in the cell body 204, so that the first cell body wall 216 and the second cell body wall 218 are thinner than walls in a comparable cell body without recesses, may accrue the advantage described in reference to FIG. 1. Having the first recess 212 and the second recess 214 extend past ends of the cavity 210 may further enable establishing the desired thermal gradient at lower power applied to the heaters 226.

Figure 3:
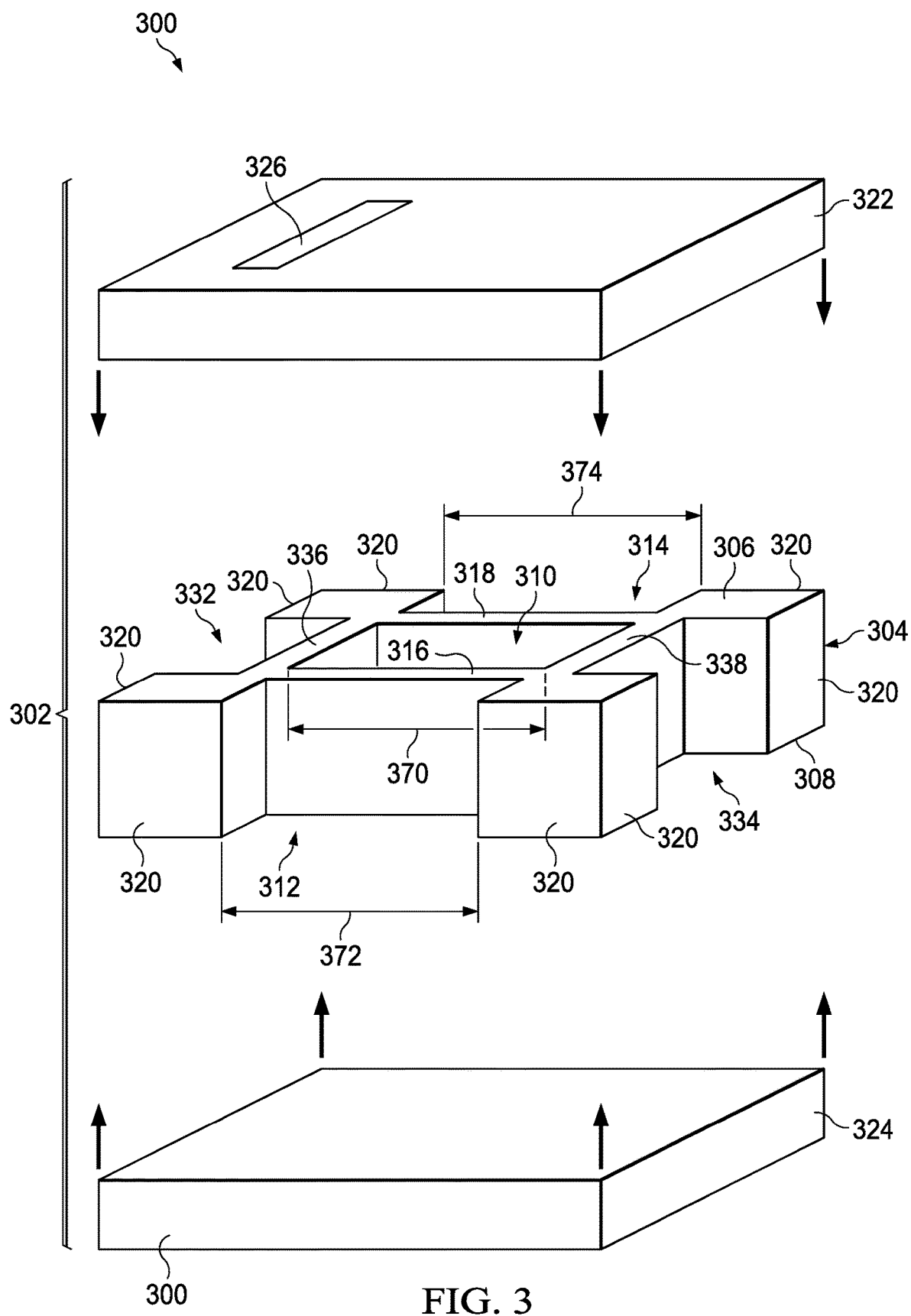
FIG. 3 is an exploded view of a further example integrated microfabricated sensor.

FIG. 3 is an exploded view of a further example integrated microfabricated sensor. The integrated microfabricated sensor 300 includes a sensor cell 302, which includes a cell body 304 having a first surface 306 and a second surface 308 parallel to, and opposite from, the first surface 306. A cavity 310 extends through the cell body 304 from the first surface 306 through the cell body 304 to the second surface 308. The cavity 310 has an average length 370 in a direction parallel to the first surface 306. The cell body 304 has a first recess 312 on a first exterior side of the cell body 304, and a second recess 314 on a second exterior side of the cell body 304 opposite from the first recess 312. The first recess 312 has an average length 372 in a direction parallel to the average length 370 of the cavity 310, and the second recess 314 has an average length 374 in a direction parallel to the average length 370 of the cavity 310. The average length 372 of the first recess 312 and the average length 374 of the second recess 314 each overlap at least half of the average length 370 of the cavity 310. A first cell body wall 316 of the cell body 304 is that portion of the cell body 304 between the first recess 312 and the cavity 310. A second cell body wall 318 of the cell body 304 is that portion of the cell body 304 between the second recess 314 and the cavity 310.

In the instant example, the cell body 304 has a third recess 332 on a third exterior side of the cell body 304, and a fourth recess 334 on a fourth exterior side of the cell body 304 opposite from the third recess 332. The third recess 332 and the fourth recess 334 are on different sides of the cell body 304 than the first recess 312 and the second recess 314. A third cell body wall 336 of the cell body 304 is that portion of the cell body 304 between the third recess 332 and the cavity 310. A fourth cell body wall 338 of the cell body 304 is that portion of the cell body 304 between the fourth recess 334 and the cavity 310. The first cell body wall 316, the second cell body wall 318, the third cell body wall 336, and the fourth cell body wall 338 are recessed from singulation surfaces 320 of the cell body 304, which may advantageously protect the cell body 304 from crack propagation from the singulation surfaces 320 into the cavity 310 on all four sides of the cell body 304.

The sensor cell 302 further includes a first window 322 that is attached to the cell body 304 on the first surface 306, so that the first window 322 is exposed to the cavity 310. The sensor cell 302 further includes a second window 324 that is attached to the cell body 304 on the second surface 308, so that the second window 324 is also exposed to the cavity 310. One or more heaters 326 may be disposed on the sensor cell 302, for example on the first window 322, as depicted in FIG. 3. Sensor fluid material, not shown in FIG. 3, is disposed in the cavity 310. The cell body 304 of the instant example may accrue the advantage described in reference to FIG. 1.

Figure 4:
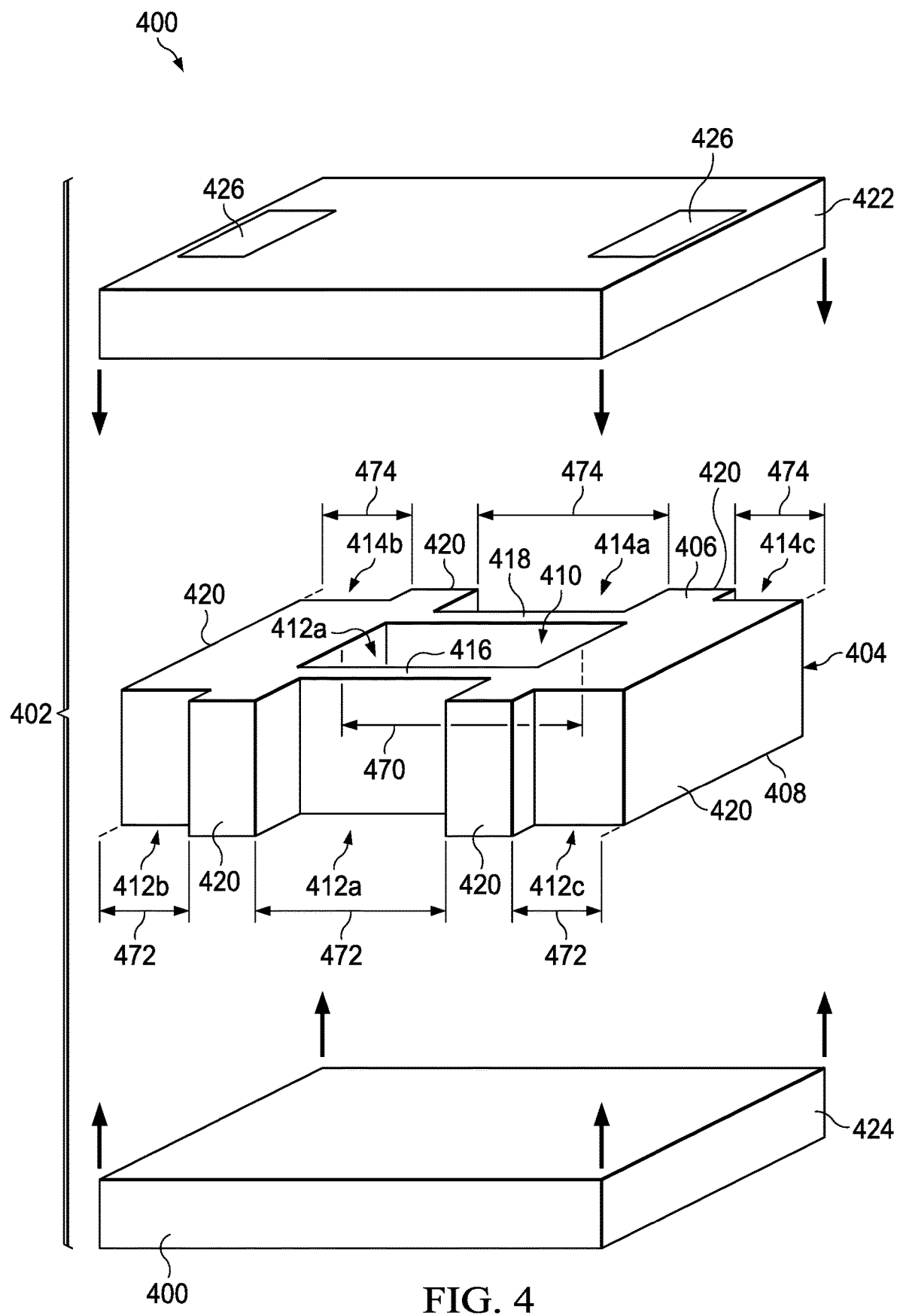
FIG. 4 is an exploded view of another example integrated microfabricated sensor.

FIG. 4 is an exploded view of another example integrated microfabricated sensor. The integrated microfabricated sensor 400 includes a sensor cell 402, which includes a cell body 404 having a first surface 406 and a second surface 408 parallel to, and opposite from, the first surface 406. A cavity 410 extends through the cell body 404 from the first surface 406 through the cell body 404 to the second surface 408. The cavity 410 has an average length 470 in a direction parallel to the first surface 406. The cell body 404 has a first recess 412 on a first exterior side of the cell body 404, and a second recess 414 on a second exterior side of the cell body 404 opposite from the first recess 412. The first recess 412 and the second recess 414 extend from the first surface 406 to the second surface 408. In the instant example, the first recess 412 is a distributed first recess 412 with first sub-recesses 412a, 412b and 412c. Similarly, the second recess 414 is a distributed second recess 414 with second sub-recesses 414a, 414b and 414c.

The first sub-recesses 412a, 412b and 412c have a combined average length 472 in a direction parallel to the average length 470 of the cavity 410. The combined average length 472 of the first sub-recesses 412a, 412b and 412c overlap at least half of the average length 470 of the cavity 410. Similarly, the second sub-recesses 414a, 414b and 414c have a combined average length 474 in a direction parallel to the average length 470 of the cavity 410. The combined average length 474 of the first sub-recesses 414a, 414b and 414c overlap at least half of the average length 470 of the cavity 410.

A first cell body wall 416 of the cell body 404 is that portion of the cell body 404 between the first recess 412 and the cavity 410. A second cell body wall 418 of the cell body 404 is that portion of the cell body 404 between the second recess 414 and the cavity 410. The first cell body wall 416 and the second cell body wall 418 are recessed from singulation surfaces 420 of the cell body 404. The first sub-recesses 412a, 412b and 412c may be recessed by different lateral distances from the singulation surfaces 420, as depicted in FIG. 4. Similarly, the second sub-recesses 414a, 414b and 414c may be recessed by different lateral distances from the singulation surfaces 420.

The sensor cell 402 further includes a first window 422 that is attached to the cell body 404 on the first surface 406, so that the first window 422 is exposed to the cavity 410. The sensor cell 402 further includes a second window 424 that is attached to the cell body 404 on the second surface 408, so that the second window 424 is also exposed to the cavity 410. Heaters 426 are disposed on the sensor cell 402. Sensor fluid material, not shown in FIG. 4, is disposed in the cavity 410.

During operation of the integrated microfabricated sensor 400, the heaters 426 may be operated so as to generate a thermal gradient in the sensor cell 402. Having the first recess 412 and the second recess 414 in the cell body 404, so that the first cell body wall 416 and the second cell body wall 418 are thinner than walls in a comparable cell body without recesses, may accrue the advantage described in reference to FIG. 1. Having the first recess 412 and the second recess 414 as distributed recesses 412 and 414 may provide structural integrity to the cell body 404 during fabrication.

Figure 5A:
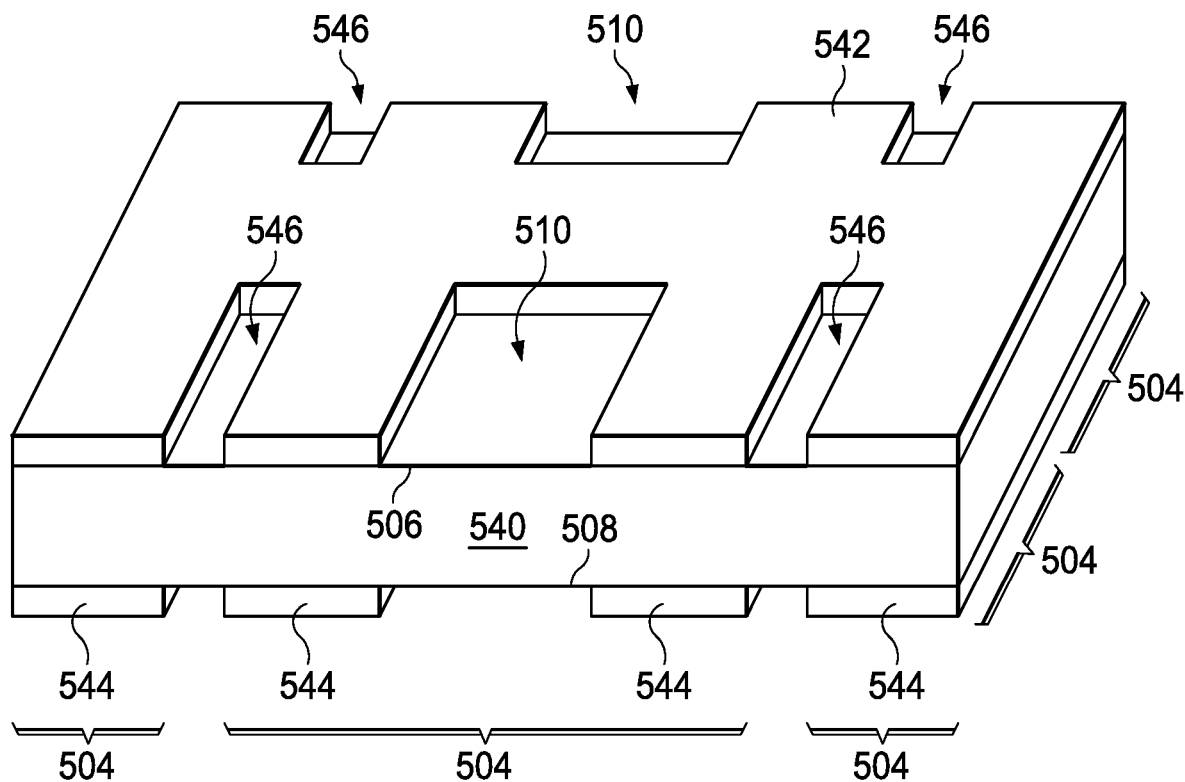
FIG. 5A through FIG. 5G are views of an integrated microfabricated sensor, depicted in successive stages of an example method of formation.

FIG. 5A through FIG. 5G are views of an integrated microfabricated sensor, depicted in successive stages of an example method of formation. Referring to FIG. 5A, a body substrate 540 is provided which includes areas for additional cell bodies 504. The body substrate 540 may be, for example, a silicon wafer, 500 micrometers to 3 millimeters thick. The body substrate 540 has a first surface 506 which is flat, and a second surface 508 which is also flat. The second surface 508 is parallel to, and located opposite from, the first surface 506.

In the instant example, a first etch mask 542 and a second etch mask 544 are formed on the first surface 506 and the second surface 508, respectively. The first etch mask 542 covers areas on the first surface 506 for cell body walls and exposes areas for cavities 510 and recesses 546 of the cell bodies 504. Similarly, the second etch mask 544 covers areas on the second surface 508 for the cell body walls and exposes areas for the cavities 510 and the recesses 546 of the cell bodies 504.

The first etch mask 542 and the second etch mask 544 may be formed, for example, by forming a layer of silicon dioxide 5 nanometers to 20 nanometers thick concurrently on the first surface 506 and the second surface 508 by a thermal oxidation process, followed by forming a layer of silicon nitride 100 nanometers to 500 nanometers thick concurrently on the first surface 506 and the second surface 508 by a low pressure chemical vapor deposition (LPCVD) process or a hotwall atmospheric pressure chemical vapor deposition (APCVD) process. Subsequently, a first temporary mask of photoresist, not shown in FIG. 5A, may be formed on the layer of silicon nitride on the first surface 506 by a photolithographic process, and the silicon nitride and silicon dioxide may be removed in areas exposed by the first temporary mask by a plasma etch process, or a reactive ion etch (RIE) process, using halogen and oxygen radicals, leaving the first etch mask 542 in place, followed by removing the first temporary mask. After the first etch mask 542 is thus formed, a second temporary mask of photoresist, not shown in FIG. 5A, may be formed on the layer of silicon nitride on the second surface 508, and the silicon nitride and silicon dioxide may be removed in areas exposed by the second temporary mask, leaving the second etch mask 544 in place, followed by removing the second temporary mask. Other methods for forming the first etch mask 542 and the second etch mask 544 are within the scope of the instant example. Silicon dioxide of the layer of silicon dioxide under the silicon nitride may be removed after the silicon nitride on both the first surface 506 and the second surface 508 is etched, for example, by a wet etch of an aqueous solution of buffered hydrofluoric acid.

Figure 5B:
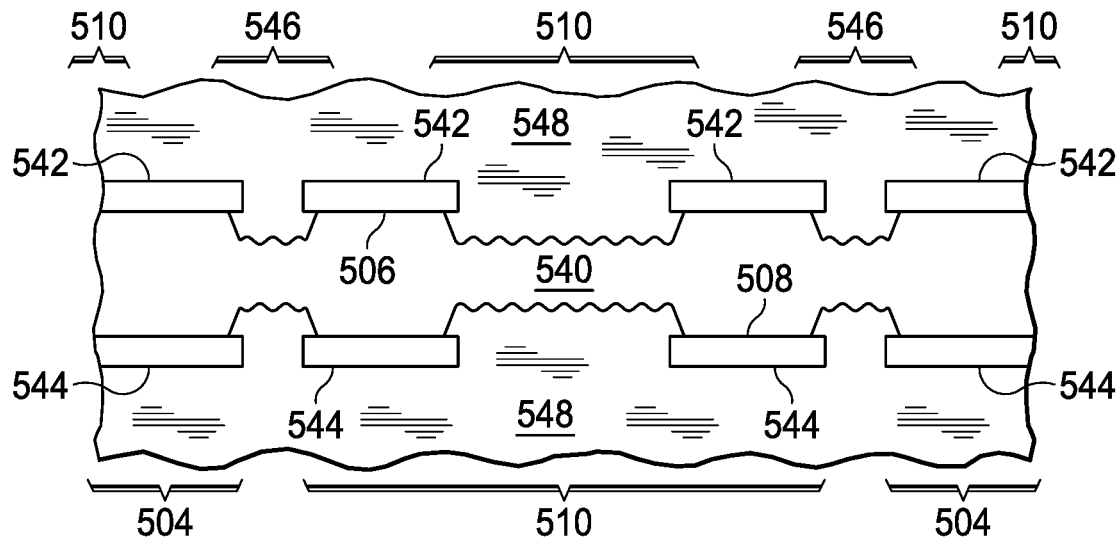

Referring to FIG. 5B, substrate material of the body substrate 540 is removed in areas exposed by the first etch mask 542 and the second etch mask 544 by an etch process, for example by a wet etch 548 of an aqueous alkaline solution such as potassium hydroxide or tetramethyl ammonium hydroxide. FIG. 5B depicts the body substrate 540 partway through the etch process. If the body substrate 540 is a silicon wafer, the wet etch 548 may remove silicon and undercut the first etch mask 542 and the second etch mask 544 to form faceted surfaces along [111] crystal planes, as depicted in FIG. 5B. The etch process of the instant example is continued until the substrate material of the body substrate 540 is completely removed in the areas exposed by the first etch mask 542 and the second etch mask 544, and the faceted surfaces are reversed, to form concave sidewall profiles.

Figure 5C:
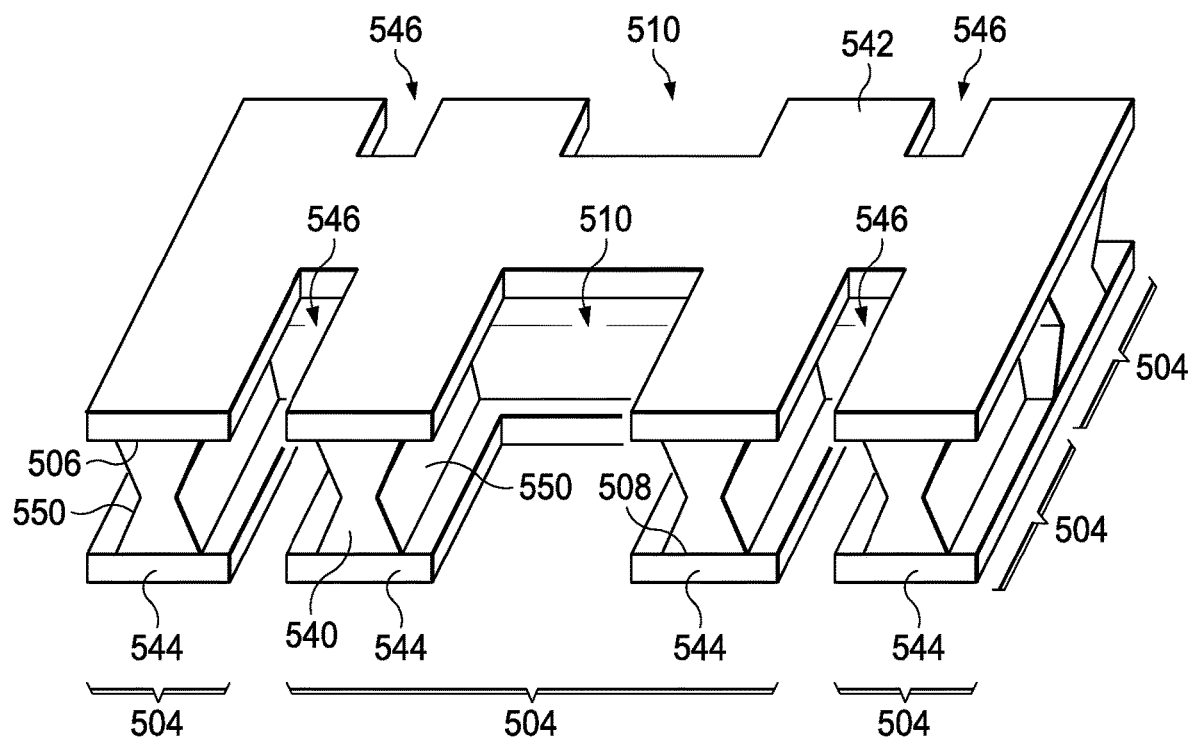

FIG. 5C depicts the body substrate 540 after the etch process of FIG. 5B is completed. In the instant example, the cell body walls 550 have faceted concave profiles, as a result of the crystallographic etch mechanism of the wet etch 548 of FIG. 5B. Other wall profiles are within the scope of the instant example. The first etch mask 542 and the second etch mask 544 are subsequently removed. Silicon nitride in the first etch mask 542 and the second etch mask 544 may be removed, for example, by a wet etch of an aqueous solution of phosphoric acid. Silicon dioxide in the first etch mask 542 and the second etch mask 544 may be removed, for example, by a wet etch of an aqueous solution of buffered hydrofluoric acid.

Figure 5D:
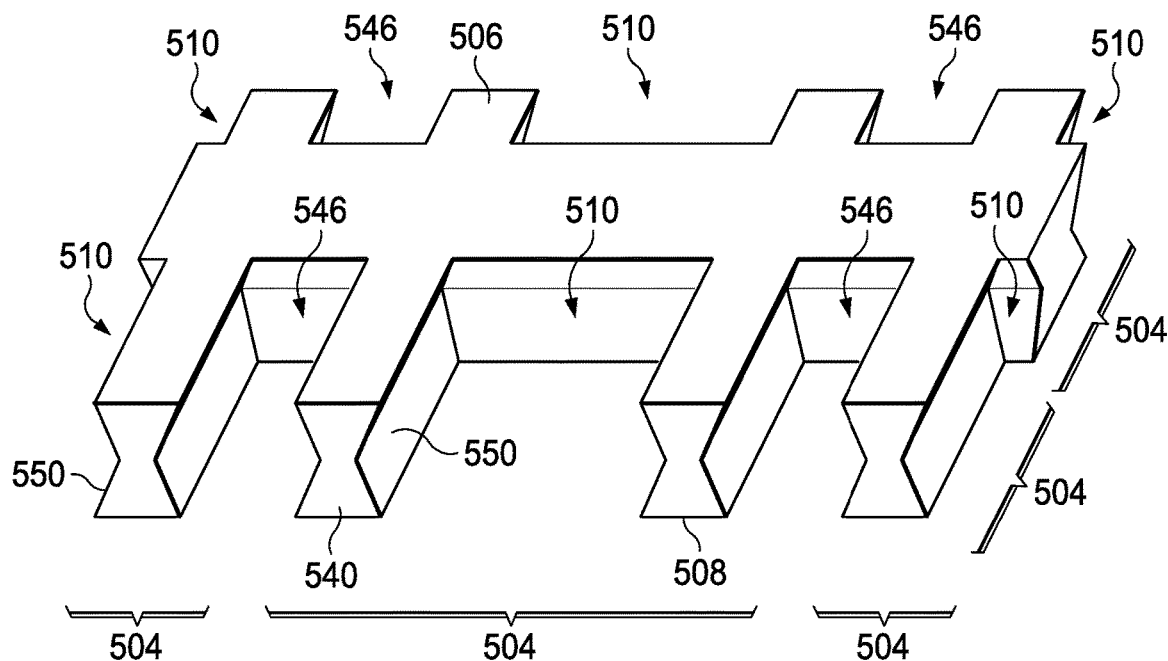

FIG. 5D depicts the body substrate 540 after the first etch mask 542 and the second etch mask 544 of FIG. 5C have been removed. The first surface 506 and the second surface 508 may be cleaned or otherwise treated to provide a desired bond to a first window and a second window, respectively.

Figure 5E:
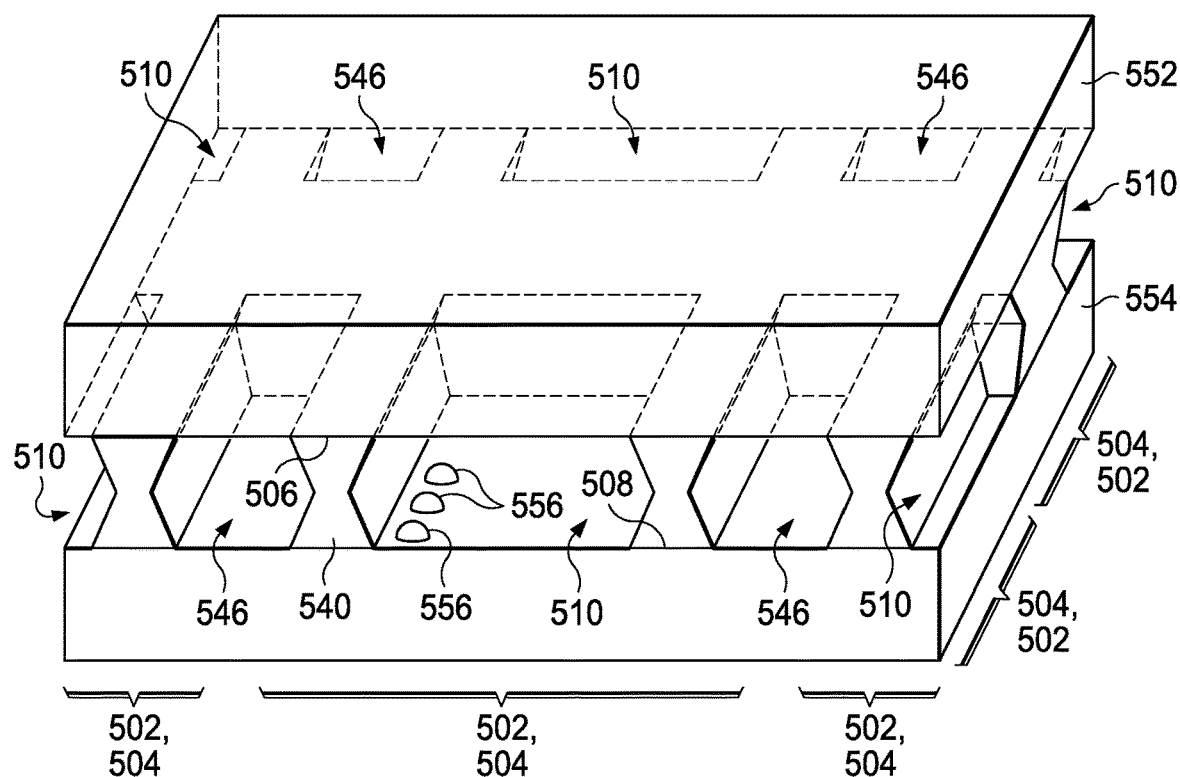

Referring to FIG. 5E, a first window substrate 552 is attached to the first surface 506 of the body substrate 540. The first window substrate 552 may be, for example, a glass wafer or other material suitable for providing first windows of the subsequently formed sensor cells 502. The first window substrate 552 may be attached, for example, by an anodic bonding process. Other methods of attaching the first window substrate 552 to the first surface 506 are within the scope of the instant example. A second window substrate 554 is attached to the second surface 508 of the body substrate 540. The second window substrate 554 may be a similar material to the first window substrate 552. The second window substrate 554 may be attached by a similar process to that used to attach the first window substrate 552.

Sensor fluid material 556 is disposed in the cavities 510. The sensor fluid material 556 may be disposed in the cavities 510 after the first window substrate 552 is attached and before the second window substrate 554 is attached. The sensor fluid material 556 may be a compound containing the sensor fluid with another element or molecule, to facilitate disposing the sensor fluid material 556 in the cavities 510 and subsequently attaching the second window substrate 554. For example, in a manifestation of the instant example in which the sensor fluid is cesium vapor, the sensor fluid material 556 may be cesium azide ($CsN_3$), which is a solid at room temperature and remains in a solid phase while the second window substrate 554 is attached by an anodic bonding process. Other materials for the sensor fluid material 556 are within the scope of the instant example.

The body substrate 540 with the attached first window substrate 552 and second window substrate 554 and the sensor fluid material 556 provide sensor cells 502 in unsingulated form. Each sensor cell 502 includes a cell body 504, also in unsingulated form.

Figure 5F:
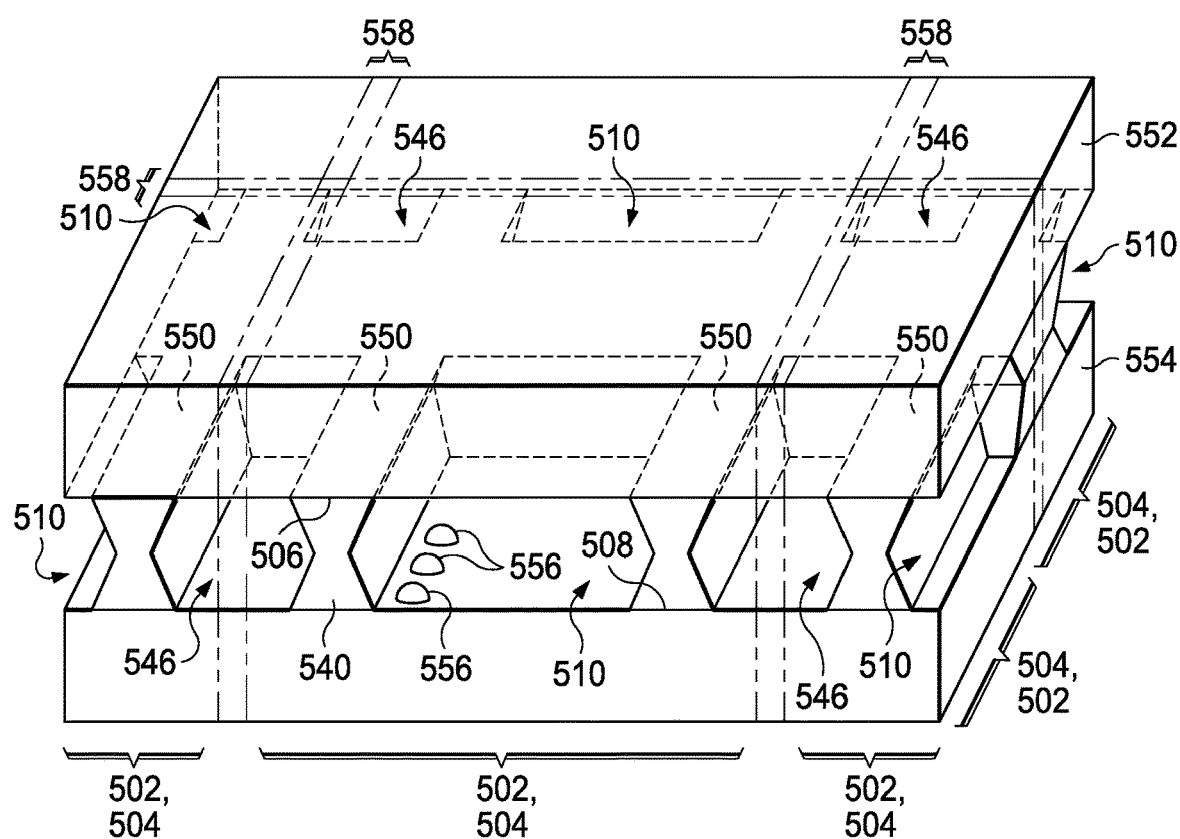

Referring to FIG. 5F, the body substrate 540 with the attached first window substrate 552 and second window substrate 554 are singulated through singulation lanes 558 to separate sensor cells 502. The body substrate 540 with the attached first window substrate 552 and second window substrate 554 may be singulated, for example, by sawing, mechanical scribing, or laser scribing. The singulation lanes 558 extend through the recesses 546. Singulating the body substrate 540 through the recesses 546 reduces mechanical damage such as cracks and fractures to cell body walls 550 between the cavities 510 and the recesses 546.

Figure 5G:
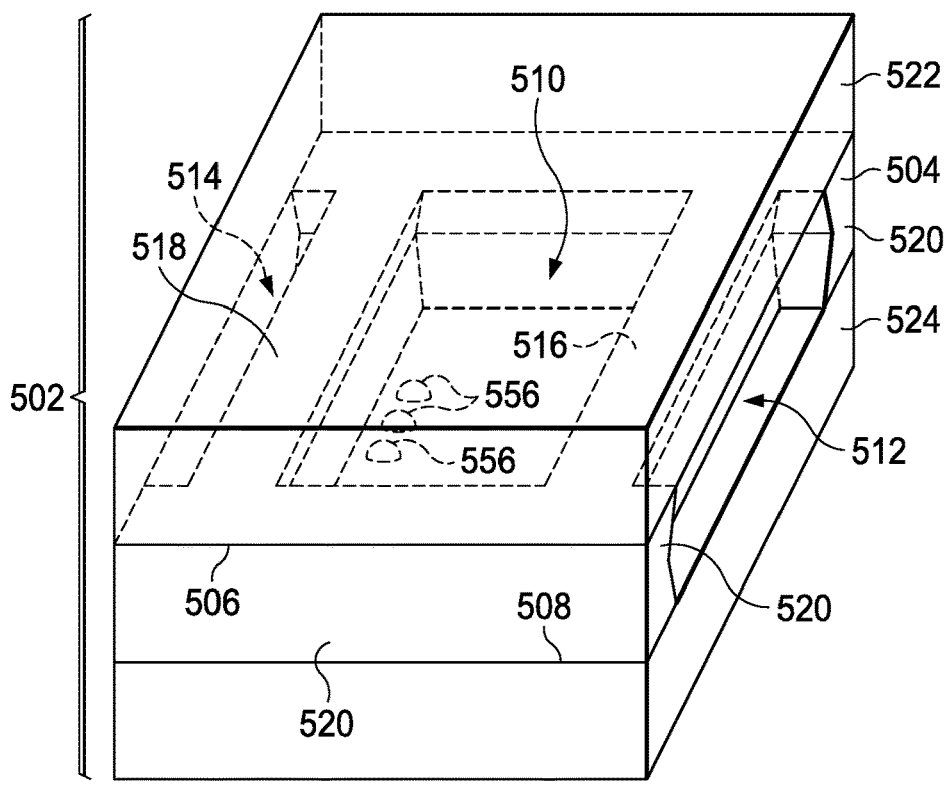

FIG. 5G depicts the singulated sensor cell 502. Singulating the body substrate 540 of FIG. 5F through the recesses 546 of FIG. 5F provides the cell body 504 with a first recess 512 and a second recess 514. The first recess 512 and the second recess 514 are located on opposite sides of the cavity 510. A first cell body wall 516 is that portion of the cell body 504 located between the cavity 510 and the first recess 512. Similarly, a second cell body wall 518 is that portion of the cell body 504 located between the cavity 510 and the second recess 514. The first recess 512 and the second recess 514 are recessed from singulated surfaces 520 of the cell body 504, advantageously protecting the first cell body wall 516 and the second cell body wall 518 from damage during singulation. Singulating the first window substrate 552 and second window substrate 554 of FIG. 5F provides a first window 522 and a second window 524, respectively. The sensor cell 502 may subsequently be assembled into an integrated microfabricated sensor, for example as described in reference to FIG. 1.

Figure 6A:
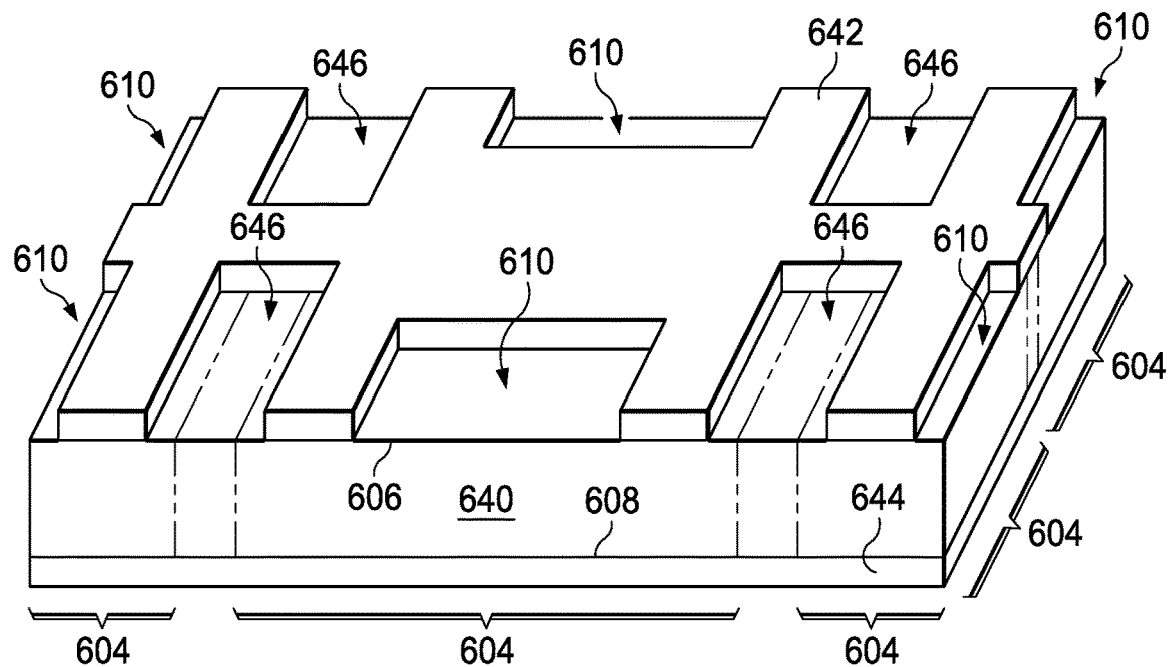
FIG. 6A through FIG. 6F are views of an integrated microfabricated sensor, depicted in successive stages of another example method of formation.

FIG. 6A through FIG. 6F are views of an integrated microfabricated sensor, depicted in successive stages of another example method of formation. Referring to FIG. 6A, a body substrate 640 is provided which includes areas for cell bodies 604. The body substrate 640 has a first surface 606 which is flat, and a second surface 608 which is also flat, parallel to, and located opposite from, the first surface 606.

In the instant example, a first etch mask 642 and a second etch mask 644 are formed on the first surface 606 and the second surface 608, respectively. The first etch mask 642 covers areas on the first surface 606 for cell body walls and exposes areas for cavities 610 and recesses 646 of the cell bodies 604. In the instant example, the areas for the recesses 646 extends past ends of the areas for the adjacent cavities 610. The second etch mask 644 covers the entire second surface 608 to prevent etching on the second surface 608.

The first etch mask 642 and the second etch mask 644 may be formed, for example, by forming a layer of silicon dioxide concurrently on the first surface 606 and the second surface 608, followed by forming a layer of silicon nitride concurrently on the first surface 606 and the second surface 608. Subsequently, a first temporary mask, not shown in FIG. 6A, may be formed on the layer of silicon nitride on the first surface 606, and the silicon nitride and silicon dioxide may be removed in areas exposed by the first temporary mask, leaving the first etch mask 642 in place, followed by removing the first temporary mask. The layer of silicon nitride and the layer of silicon dioxide on the second surface 608 provides the second etch mask 644. Patterning the first etch mask 642 and not patterning the second etch mask 644 may reduce fabrication cost and complexity.

Other methods for forming the first etch mask 642 and the second etch mask 644 are within the scope of the instant example.

Figure 6B:
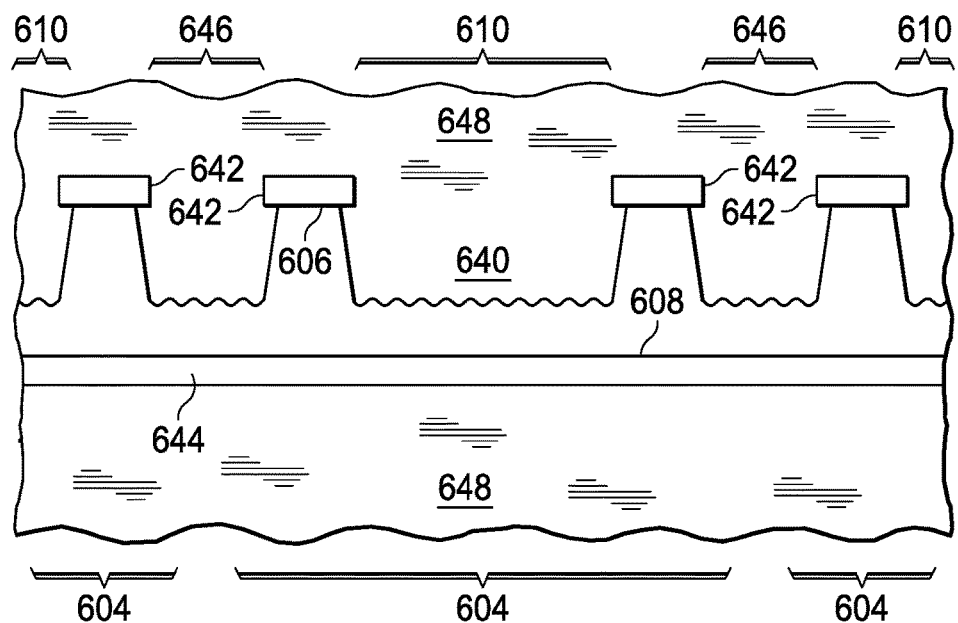

Referring to FIG. 6B, substrate material of the body substrate 640 is removed in areas exposed by the first etch mask 642 by an etch process, for example by a wet etch 648. FIG. 6B depicts the body substrate 640 partway through the etch process. In the instant example, the second etch mask 644, covering the second surface 608, prevents removal of the substrate material at the second surface 608. The wet etch 648 may form faceted surfaces in the body substrate 640, as depicted in FIG. 6B. The etch process may be continued until the substrate material of the body substrate 640 is completely removed in the areas exposed by the first etch mask 642.

Figure 6C:
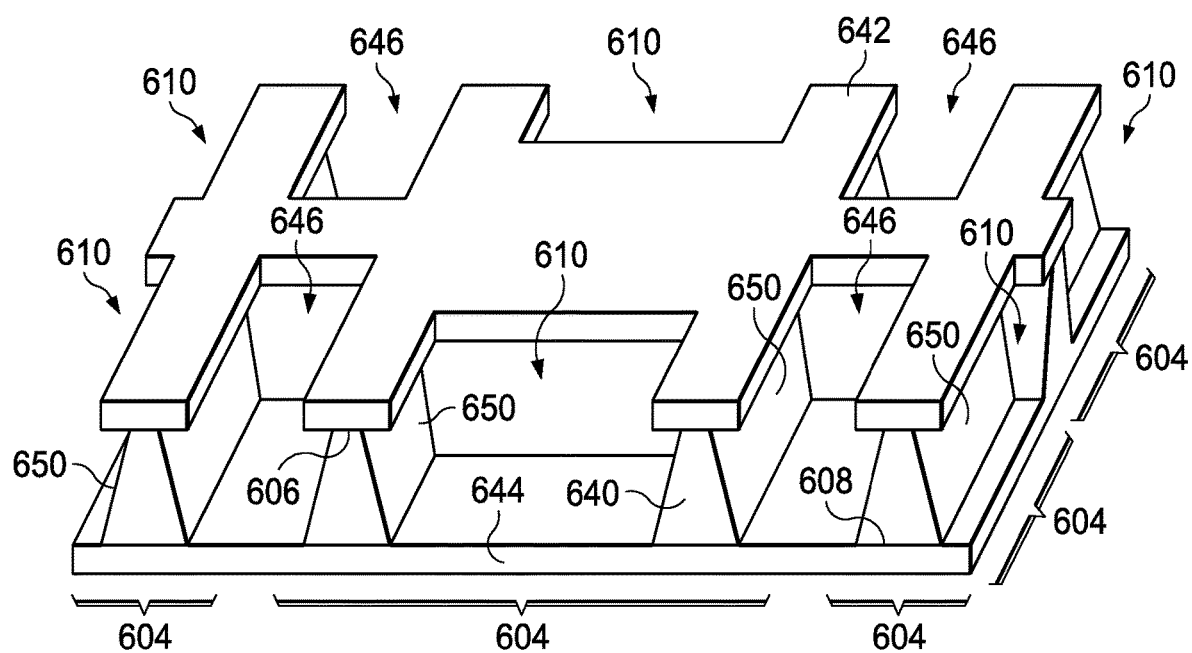

FIG. 6C depicts the body substrate 640 after the etch process of FIG. 6B is completed. In the instant example, the cell body walls 650 have faceted sloped profiles, as a result of the crystallographic etch mechanism of the wet etch 648 of FIG. 6B. Other wall profiles are within the scope of the instant example. The first etch mask 642 and the second etch mask 644 are subsequently removed.

Figure 6D:
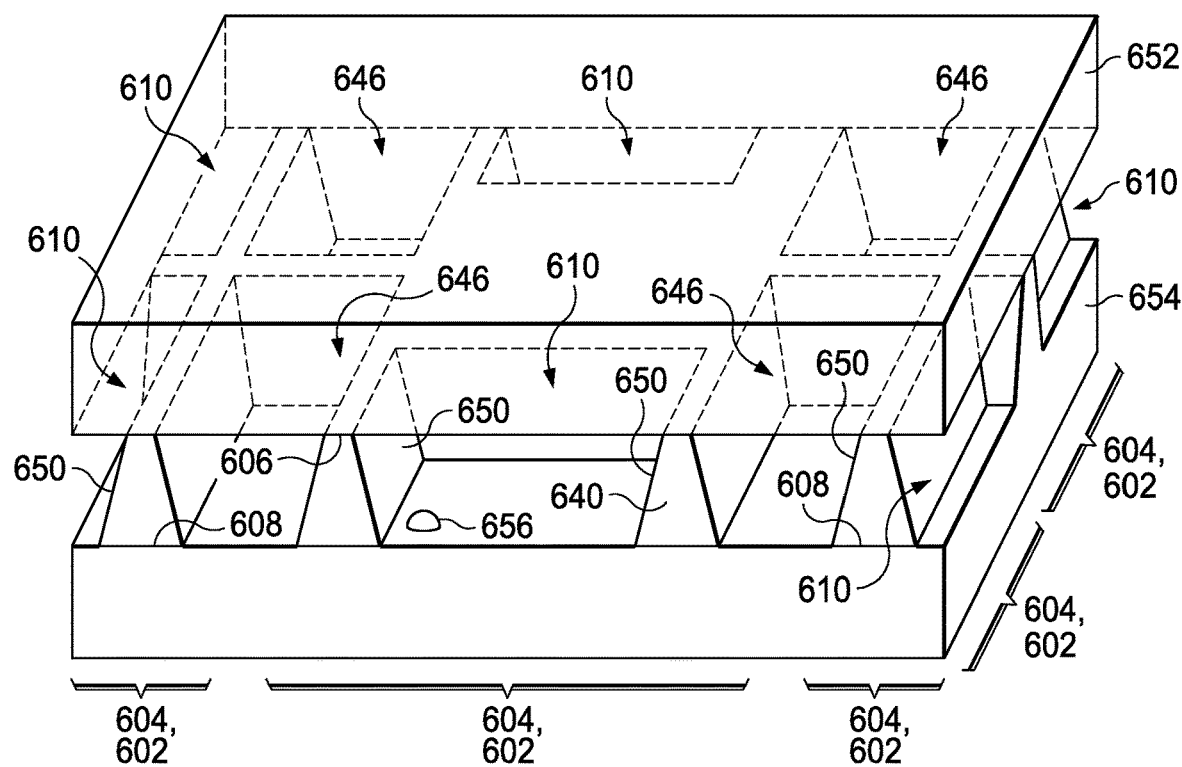

Referring to FIG. 6D, a first window substrate 652 is attached to the first surface 606 of the body substrate 640. A second window substrate 654 is attached to the second surface 608 of the body substrate 640. Sensor fluid material 656 is disposed in the cavities 610. The sensor fluid material 656 is disposed in the cavities 610, for example after the first window substrate 652 is attached and before the second window substrate 654 is attached. The body substrate 640 with the attached first window substrate 652 and second window substrate 654 and the sensor fluid material 656 provide sensor cells 602 in unsingulated form. Each sensor cell 602 includes a cell body 604, also in unsingulated form.

Figure 6E:
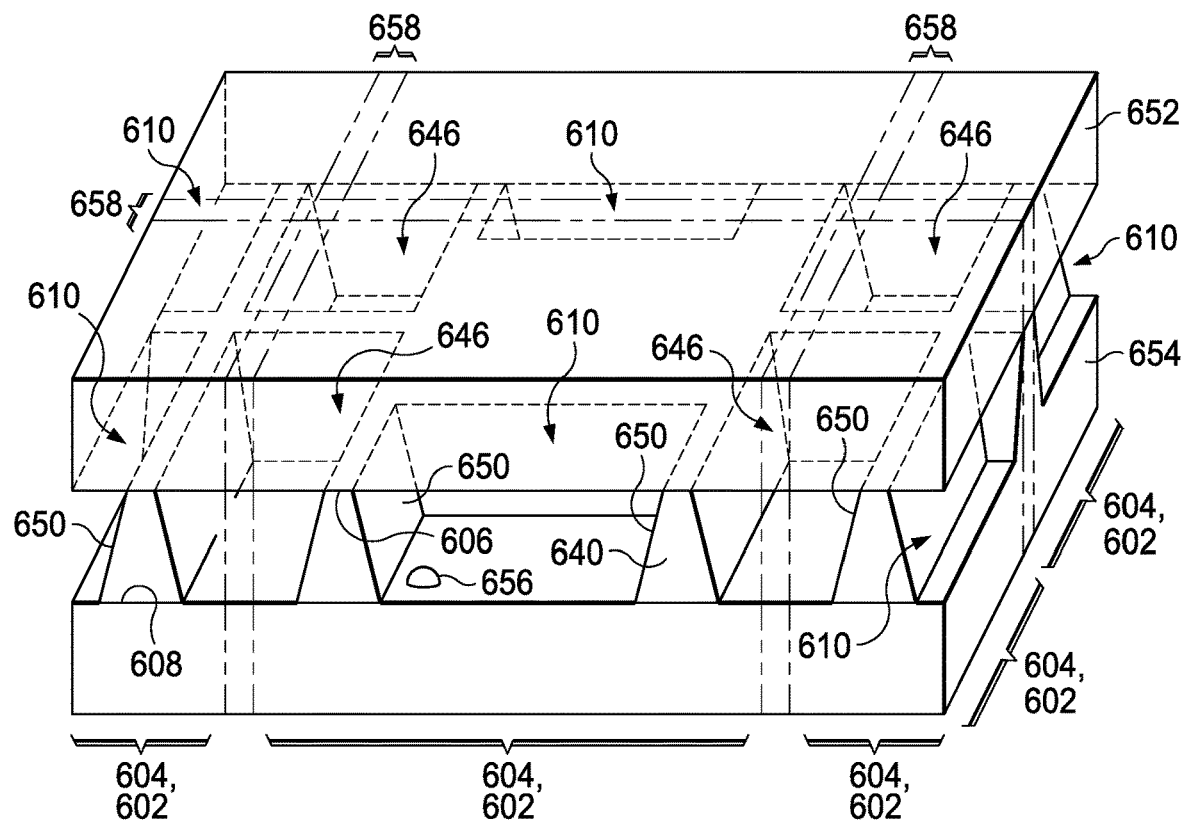

Referring to FIG. 6E, the body substrate 640 with the attached first window substrate 652 and second window substrate 654 are singulated through singulation lanes 658 to separate sensor cells 602. The singulation lanes 658 extend through the recesses 646. Singulating the body substrate 640 through the recesses 646 reduces mechanical damage such as cracks and fractures to cell body walls 650 between the cavities 610 and the recesses 646.

Figure 6F:
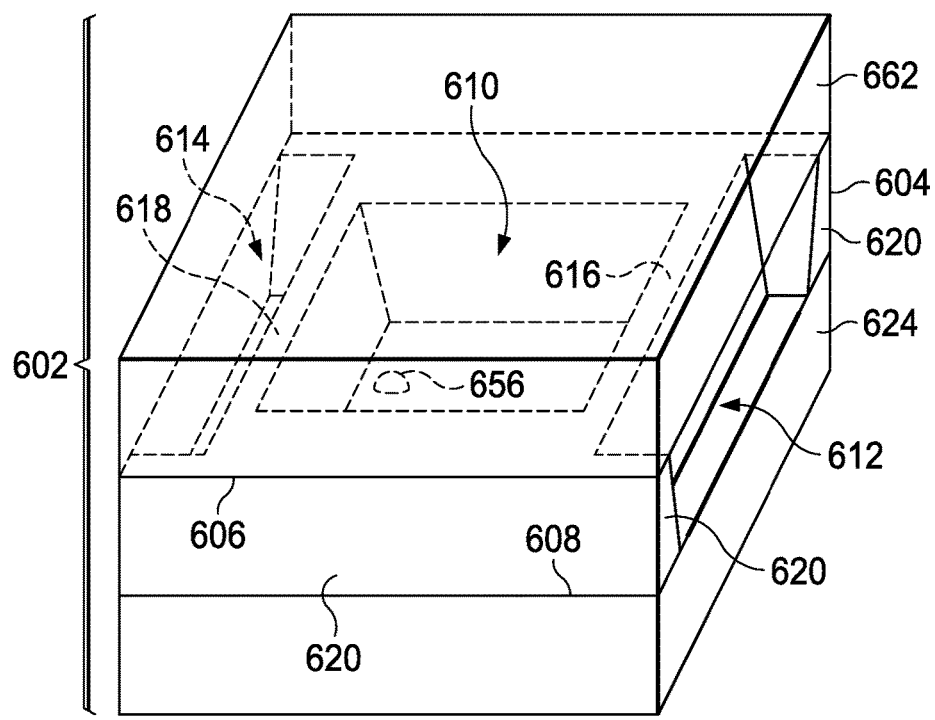

FIG. 6F depicts the singulated sensor cell 602. Singulating the body substrate 640 of FIG. 6E through the recesses 646 of FIG. 6E provides the cell body 604 with a first recess 612 and a second recess 614. The first recess 612 and the second recess 614 are located on opposite sides of the cavity 610. In the instant example, the first recess 612 and the second recess 614 extend past ends of the cavity 610. A first cell body wall 616 is that portion of the cell body 604 located between the cavity 610 and the first recess 612. Similarly, a second cell body wall 618 is that portion of the cell body 604 located between the cavity 610 and the second recess 614. The first recess 612 and the second recess 614 are recessed from singulated surfaces 620 of the cell body 604. Singulating the first window substrate 652 and second window substrate 654 of FIG. 6E provides a first window 622 and a second window 624, respectively. The sensor cell 602 may subsequently be assembled into an integrated microfabricated sensor, for example as described in reference to FIG. 2.

Figure 7A:
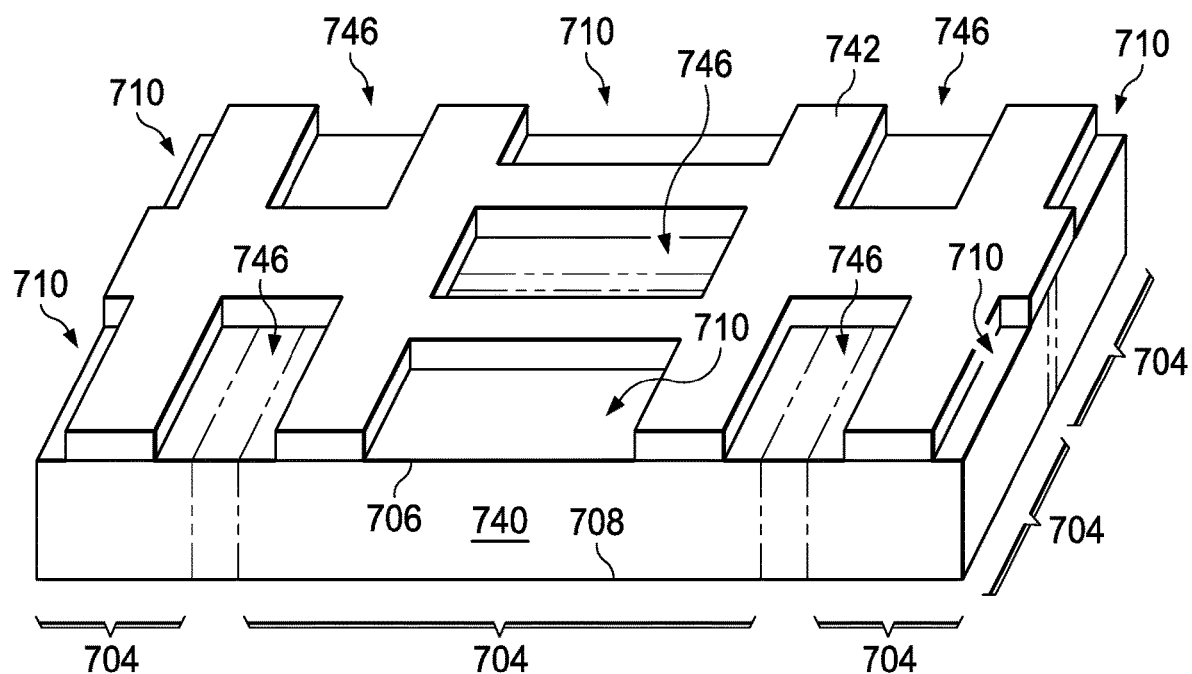
FIG. 7A through FIG. 7E are views of an integrated microfabricated sensor, depicted in successive stages of another example method of formation.

FIG. 7A through FIG. 7E are views of an integrated microfabricated sensor, depicted in successive stages of another example method of formation. Referring to FIG. 7A, a body substrate 740 is provided which includes areas for cell bodies 704. The body substrate 740 has a first surface 706 which is flat, and a second surface 708 which is also flat, parallel to, and located opposite from, the first surface 706. In the instant example, a first etch mask 742 is formed on the first surface 706. The second surface 708 may optionally be left exposed, as depicted in FIG. 7A, or may be covered with a protective layer. The first etch mask 742 covers areas on the first surface 706 for cell body walls and exposes areas for cavities 710 and recesses 746 of the cell bodies 704. In the instant example, the areas for the recesses 746 are located on all four sides of the areas for the adjacent cavities 710. The first etch mask 742 may be formed, for example, as described in reference to FIG. 5A or FIG. 6A. Other methods for forming the first etch mask 742 are within the scope of the instant example.

Figure 7B:
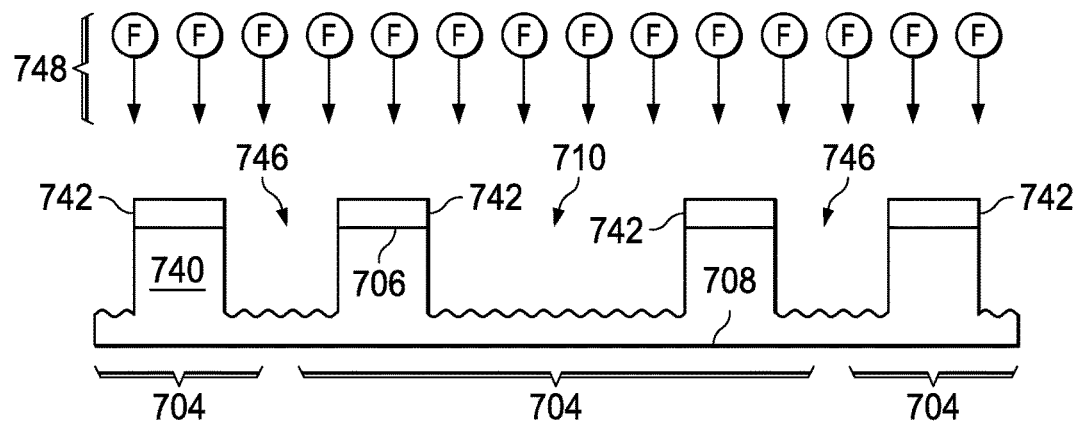

Referring to FIG. 7B, substrate material of the body substrate 740 is removed in areas exposed by the first etch mask 742 by an etch process, for example by a deep reactive ion etch (DRIE) process using halogen radicals 748 such as fluorine radicals as indicated in FIG. 7B. FIG. 7B depicts the body substrate 740 partway through the etch process. In the instant example, the halogen radicals 748 are applied to the first surface 706 only, so that the substrate material is not removed at the second surface 708. The DRIE process may form vertical sidewalls in the body substrate 740, as depicted in FIG. 7B. The DRIE process may be continued until the substrate material of the body substrate 740 is completely removed in the areas exposed by the first etch mask 742.

Figure 7C:
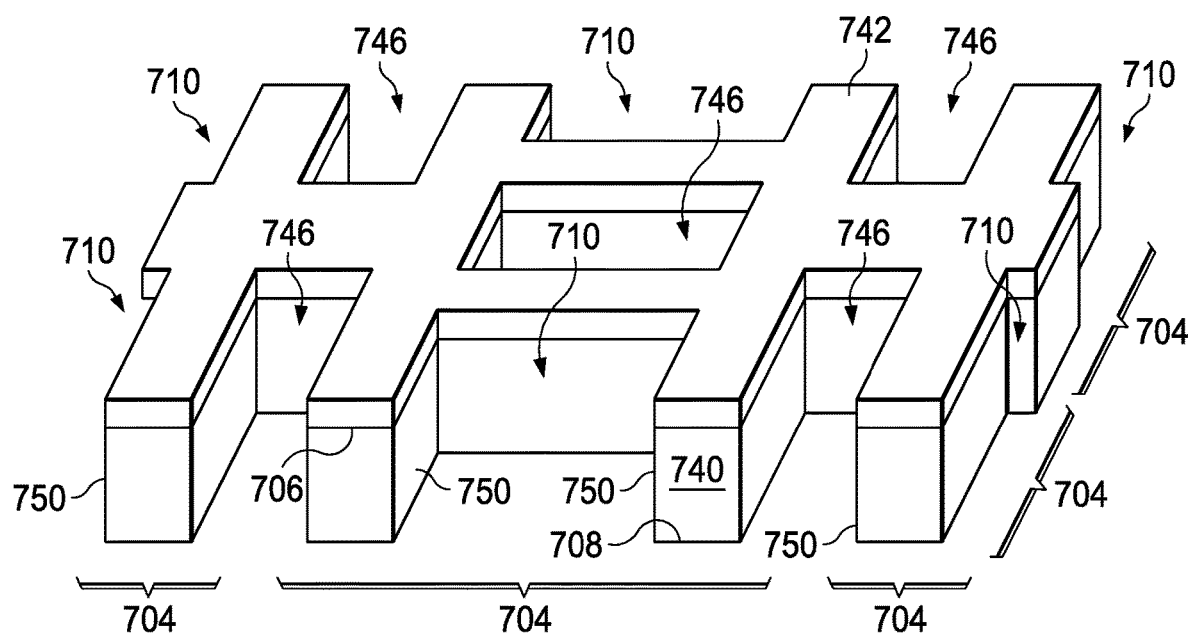

FIG. 7C depicts the body substrate 740 after the etch process of FIG. 7B is completed. In the instant example, the cell body walls 750 have vertical profiles, as a result of the ion etch mechanism of the DRIE process of FIG. 7B. Other wall profiles are within the scope of the instant example. The first etch mask 742 is subsequently removed.

Figure 7D:
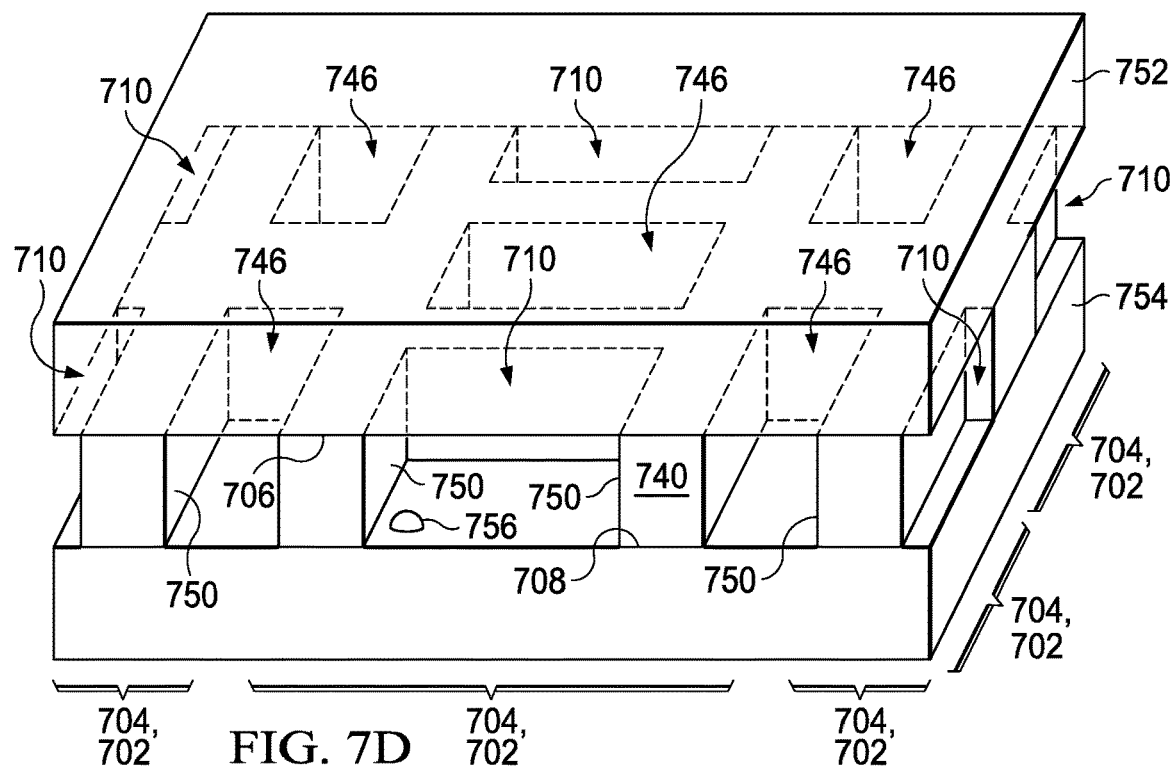

Referring to FIG. 7D, a first window substrate 752 is attached to the first surface 706 of the body substrate 740. A second window substrate 754 is attached to the second surface 708 of the body substrate 740. Sensor fluid material 756 is disposed in the cavities 710. The sensor fluid material 756 is disposed in the cavities 710, for example after the first window substrate 752 is attached and before the second window substrate 754 is attached. The body substrate 740 with the attached first window substrate 752 and second window substrate 754 and the sensor fluid material 756 provide sensor cells 702 in unsingulated form. Each sensor cell 702 includes a cell body 704, also in unsingulated form.

Figure 7E:
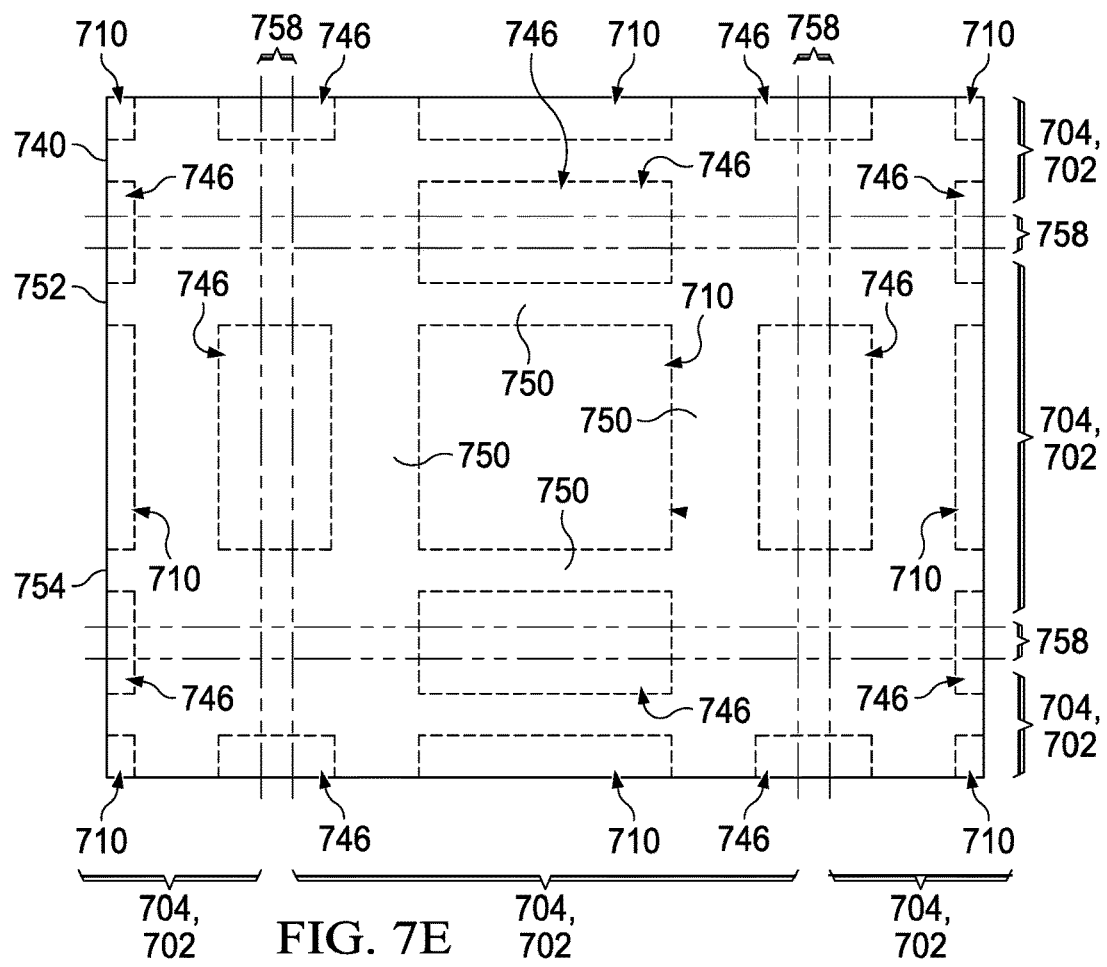

Referring to FIG. 7E, which is a top view, the body substrate 740 with the attached first window substrate 752 and second window substrate 754 are singulated through singulation lanes 758 to separate sensor cells 702. The singulation lanes 758 extend through the recesses 746. Singulating the body substrate 740 through the recesses 746 reduces mechanical damage such as cracks and fractures to cell body walls 750 between the cavities 710 and the recesses 746 on all four sides of the cavities 710.

Figure 8:
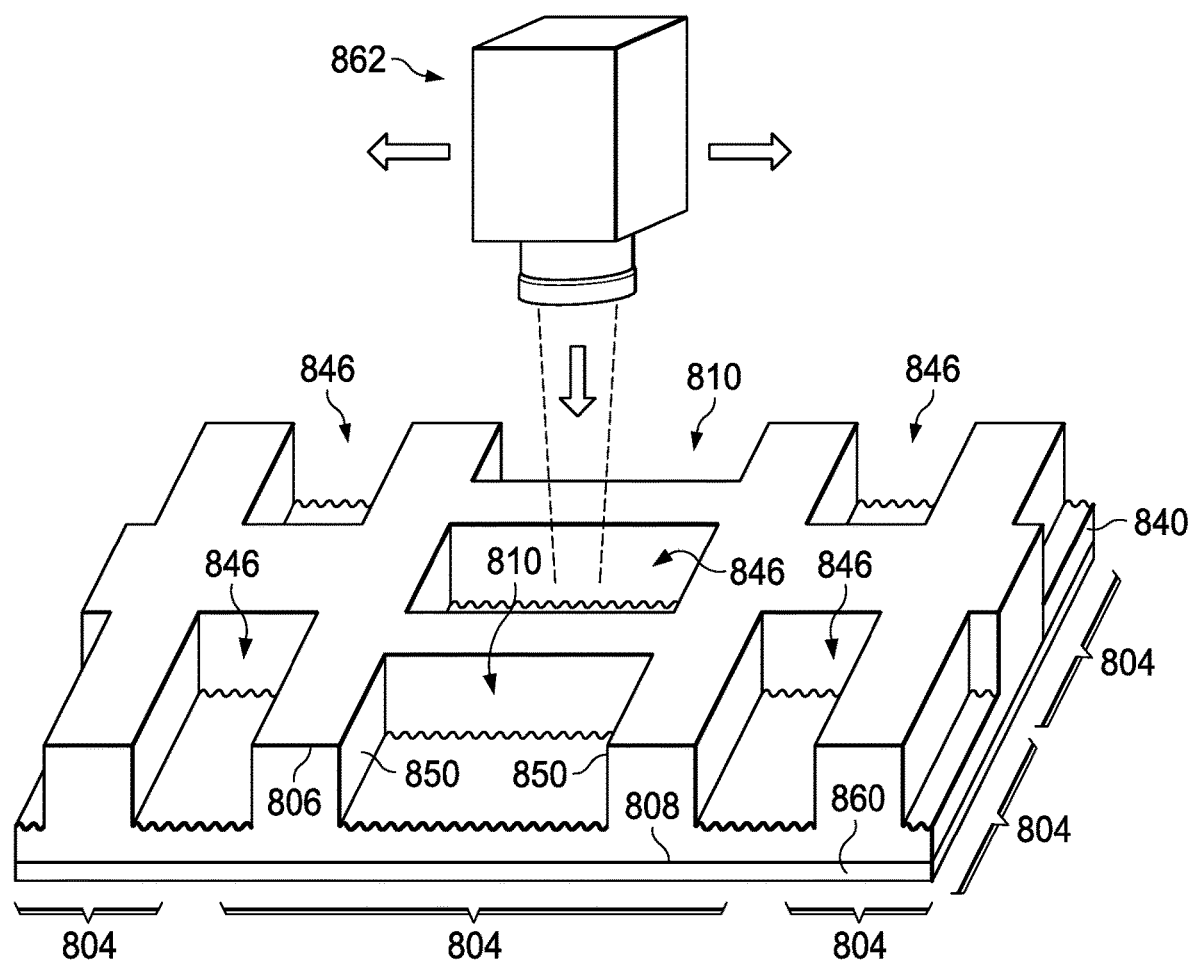
FIG. 8 depicts a further example method of forming an integrated microfabricated sensor.

FIG. 8 depicts a further example method of forming an integrated microfabricated sensor. A body substrate 840 is provided which includes areas for cell bodies 804. The body substrate 840 has a first surface 806 which is flat, and a second surface 808 which is also flat, parallel to, and located opposite from, the first surface 806. An optional bottom layer 860 may be formed on the second surface 808 to protect the second surface 808 during subsequent processing. The optional bottom layer 860 may include, for example, silicon dioxide and/or organic polymer.

In the instant example, substrate material of the body substrate 840 is removed in areas for cavities 810 and recesses 846 of the cell bodies 804 by a maskless subtractive process, for example, using a scanned laser ablation system 862 as depicted in FIG. 8, leaving the substrate material in areas for cell body walls 850 located between the cavities 810 and the recesses 846. FIG. 8 depicts the maskless subtractive process partway to completion. Other maskless subtractive processes for removing the substrate material, such as scanned electrochemical etching or scanned photochemical etching, are within the scope of the instant example. The maskless subtractive process is continued until the substrate material of the body substrate 840 is completely removed in the areas for the cavities 810 and the areas for the recesses 846. The cavities 810 and recesses 846 are formed concurrently by the maskless subtractive process. In the instant example, the term "formed concurrently" is understood to apply to forming the cavities 810 and recesses 846, as the cavities 810 and recesses 846 are formed in an operation of the maskless subtractive process, even though formation of one instance of the cavities 810 may be completed before formation of a corresponding instance of the recesses 846 is completed during the operation of the maskless subtractive process. The optional bottom layer 860, if present, is subsequently removed. Forming the cavities 810 and the recesses 846 using the maskless subtractive process may reduce fabrication complexity and improve design flexibility.

A first window substrate, not shown in FIG. 8, is subsequently attached to the first surface 806, a sensor fluid material is disposed into the cavities 810, and a second window substrate, also not shown, is attached to the second surface 808, for example as disclosed in the examples herein. The body substrate 840 with the attached first window substrate and attached second window substrate is singulated to form a cell body of the integrated microfabricated sensor.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated microfabricated sensor, comprising:
   a sensor cell, comprising:
      a cell body having:
         a first surface;
         a second surface parallel to the first surface, the cell body defining a cavity extending between the first surface and the second surface and having an average length in a direction parallel to the first surface;
         a first recess on a first exterior side of the cell body, the first recess extending between the first surface and the second surface and having an average length in a direction parallel to the average length of the cavity, the average length of the first recess overlapping at least half of the average length of the cavity; and
         a second recess on a second exterior side of the cell body, the second recess extending between the first surface and the second surface and having an average length in a direction parallel to the average length of the cavity, the average length of the second recess overlapping at least half of the average length of the cavity;
      a first window adjacent to the first surface and exposed to the cavity;
      a second window adjacent to the second surface and exposed to the cavity; and
      a sensor fluid material in the cavity;
   a signal emitter outside of the sensor cell and proximate to the second window; and
   a signal detector outside of the sensor cell and proximate to the first window,
   wherein the first recess is a distributed first recess comprising first sub-recesses, and the second recess is a distributed second recess comprising second sub-recesses.

2. The integrated microfabricated sensor of claim 1, wherein the first recess extends past ends of the cavity, and the second recess extends past the ends of the cavity.

3. The integrated microfabricated sensor of claim 1, wherein:
   the cell body has a third recess on a third exterior side of the cell body separate from the first exterior side and the second exterior side, the third recess extending between the first surface and the second surface; and
   the cell body has a fourth recess on a fourth exterior side of the cell body separate from the first exterior side, the second exterior side, and the third exterior side, the fourth recess extending between the first surface and the second surface.

4. The integrated microfabricated sensor of claim 1, wherein the sensor cell further includes a heater proximate to an end of the cavity.

5. The integrated microfabricated sensor of claim 1, wherein a first cell body wall of the cell body and a second cell body wall of the cell body have faceted profiles, the first cell body wall being a portion of the cell body located between the cavity and the first recess, the second cell body wall being a portion of the cell body located between the cavity and the second recess.

6. The integrated microfabricated sensor of claim 1, wherein a first cell body wall of the cell body and a second cell body wall of the cell body have tapered profiles, the first cell body wall being a portion of the cell body located between the cavity and the first recess, the second cell body wall being a portion of the cell body located between the cavity and the second recess.

7. The integrated microfabricated sensor of claim 1, wherein a first cell body wall of the cell body and a second cell body wall of the cell body have vertical profiles, the first cell body wall being a portion of the cell body located between the cavity and the first recess, the second cell body wall being a portion of the cell body located between the cavity and the second recess.

8. An integrated microfabricated sensor, comprising:
   a sensor cell, comprising:
      a cell body having:
         a first surface;
         a second surface parallel to the first surface, the cell body defining a cavity extending between the first surface and the second surface and having an average length in a direction parallel to the first surface;
         a first recess on a first exterior side of the cell body, the first recess extending between the first surface and the second surface and having an average length in a direction parallel to the average length of the cavity, the average length of the first recess overlapping at least half of the average length of the cavity; and
         a second recess on a second exterior side of the cell body, the second recess extending between the first surface and the second surface and having an average length in a direction parallel to the average length of the cavity, the average length of the second recess overlapping at least half of the average length of the cavity;
      a first window adjacent to the first surface and exposed to the cavity;
      a second window adjacent to the second surface and exposed to the cavity; and
      a sensor fluid material in the cavity;
   a signal emitter outside of the sensor cell and proximate to the second window; and
   a signal detector outside of the sensor cell and proximate to the first window, wherein a first cell body wall of the cell body and a second cell body wall of the cell body have faceted profiles, the first cell body wall being a portion of the cell body located between the cavity and the first recess, the second cell body wall being a portion of the cell body located between the cavity and the second recess.

9. The integrated microfabricated sensor of claim 8, wherein the first recess extends past ends of the cavity, and the second recess extends past the ends of the cavity.

10. The integrated microfabricated sensor of claim 8, wherein:
the cell body has a third recess on a third exterior side of the cell body separate from the first exterior side and the second exterior side, the third recess extending between the first surface and the second surface; and
the cell body has a fourth recess on a fourth exterior side of the cell body separate from the first exterior side, the second exterior side, and the third exterior side, the fourth recess extending between the first surface and the second surface.

11. The integrated microfabricated sensor of claim 8, wherein the first recess is a distributed first recess comprising first sub-recesses, and the second recess is a distributed second recess comprising second sub-recesses.

12. The integrated microfabricated sensor of claim 8, wherein the sensor cell further includes a heater proximate to an end of the cavity.

13. An integrated microfabricated sensor, comprising:
a sensor cell, comprising:
a cell body having:
a first surface;
a second surface parallel to the first surface, the cell body defining a cavity extending between the first surface and the second surface and having an average length in a direction parallel to the first surface;
a first recess on a first exterior side of the cell body, the first recess extending between the first surface and the second surface and having an average length in a direction parallel to the average length of the cavity, the average length of the first recess overlapping at least half of the average length of the cavity; and
a second recess on a second exterior side of the cell body, the second recess extending between the first surface and the second surface and having an average length in a direction parallel to the average length of the cavity, the average length of the second recess overlapping at least half of the average length of the cavity;
a first window adjacent to the first surface and exposed to the cavity;
a second window adjacent to the second surface and exposed to the cavity; and
a sensor fluid material in the cavity;
a signal emitter outside of the sensor cell and proximate to the second window; and
a signal detector outside of the sensor cell and proximate to the first window,
wherein a first cell body wall of the cell body and a second cell body wall of the cell body have tapered profiles, the first cell body wall being a portion of the cell body located between the cavity and the first recess, the second cell body wall being a portion of the cell body located between the cavity and the second recess.

14. The integrated microfabricated sensor of claim 13, wherein the first recess extends past ends of the cavity, and the second recess extends past the ends of the cavity.

15. The integrated microfabricated sensor of claim 13, wherein:
the cell body has a third recess on a third exterior side of the cell body separate from the first exterior side and the second exterior side, the third recess extending between the first surface and the second surface; and
the cell body has a fourth recess on a fourth exterior side of the cell body separate from the first exterior side, the second exterior side, and the third exterior side, the fourth recess extending between the first surface and the second surface.

16. The integrated microfabricated sensor of claim 13, wherein the first recess is a distributed first recess comprising first sub-recesses, and the second recess is a distributed second recess comprising second sub-recesses.

17. The integrated microfabricated sensor of claim 13, wherein the sensor cell further includes a heater proximate to an end of the cavity.

18. An integrated microfabricated sensor, comprising:
a sensor cell, comprising:
a cell body having:
a first surface;
a second surface parallel to the first surface, the cell body defining a cavity extending between the first surface and the second surface and having an average length in a direction parallel to the first surface;
a first recess on a first exterior side of the cell body, the first recess extending between the first surface and the second surface and having an average length in a direction parallel to the average length of the cavity, the average length of the first recess overlapping at least half of the average length of the cavity; and
a second recess on a second exterior side of the cell body, the second recess extending between the first surface and the second surface and having an average length in a direction parallel to the average length of the cavity, the average length of the second recess overlapping at least half of the average length of the cavity;
a first window adjacent to the first surface and exposed to the cavity;
a second window adjacent to the second surface and exposed to the cavity; and
a sensor fluid material in the cavity;
a signal emitter outside of the sensor cell and proximate to the second window; and
a signal detector outside of the sensor cell and proximate to the first window,
wherein a first cell body wall of the cell body and a second cell body wall of the cell body have vertical profiles, the first cell body wall being a portion of the cell body located between the cavity and the first recess, the second cell body wall being a portion of the cell body located between the cavity and the second recess.

19. The integrated microfabricated sensor of claim 18, wherein the first recess extends past ends of the cavity, and the second recess extends past the ends of the cavity.

20. The integrated microfabricated sensor of claim 18, wherein:
the cell body has a third recess on a third exterior side of the cell body separate from the first exterior side and the second exterior side, the third recess extending between the first surface and the second surface; and the cell body has a fourth recess on a fourth exterior side of the cell body separate from the first exterior side, the second exterior side, and the third exterior side, the fourth recess extending between the first surface and the second surface.

21. The integrated microfabricated sensor of claim 18, wherein the first recess is a distributed first recess comprising first sub-recesses, and the second recess is a distributed second recess comprising second sub-recesses.

22. The integrated microfabricated sensor of claim 18, wherein the sensor cell further includes a heater proximate to an end of the cavity.

23. An integrated microfabricated sensor, comprising:
   a sensor cell, comprising:
      a cell body having:
         a first surface;
         a second surface parallel to the first surface and located on an opposing side of the cell body from the first surface, the cell body defining a cavity extending from an opening in the first surface to an opening in the second surface and having an average length in a direction parallel to the first surface;
      a first recess on a first exterior side of the cell body, the first recess extending between the first surface and the second surface and having an average length in a direction parallel to the average length of the cavity, the average length of the first recess overlapping at least half of the average length of the cavity; and
      a second recess on a second exterior side of the cell body, the second recess extending between the first surface and the second surface and having an average length in a direction parallel to the average length of the cavity, the average length of the second recess overlapping at least half of the average length of the cavity;
   a first window adjacent to the first surface and exposed to the cavity;
   a second window adjacent to the second surface and exposed to the cavity; and
   a sensor fluid material sealed in the cavity by the first and second windows.

\* \* \* \* \*